(12) United States Patent
Seamons et al.

(10) Patent No.: US 7,094,442 B2
(45) Date of Patent: Aug. 22, 2006

(54) METHODS FOR THE REDUCTION AND ELIMINATION OF PARTICULATE CONTAMINATION WITH CVD OF AMORPHOUS CARBON

(75) Inventors: Martin Jay Seamons, San Jose, CA (US); Wendy H. Yeh, Mountain View, CA (US); Sudha S. R. Rathi, San Jose, CA (US); Heraldo L. Botelho, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 98 days.

(21) Appl. No.: 10/891,355

(22) Filed: Jul. 13, 2004

(65) Prior Publication Data

US 2006/0014397 A1    Jan. 19, 2006

(51) Int. Cl.
*B05D 5/12*   (2006.01)

(52) U.S. Cl. ............... 427/122; 427/249.1; 427/255.5; 427/569; 438/482; 438/789; 438/790

(58) Field of Classification Search ............. 427/255.5, 427/122
See application file for complete search history.

(56) References Cited

U.S. PATENT DOCUMENTS

| | | | |
|---|---|---|---|
| 5,022,959 A | 6/1991 | Itoh et al. | |
| 5,674,573 A | 10/1997 | Mitani et al. | |
| 5,998,100 A | 12/1999 | Azuma et al. | |
| 6,214,637 B1 | 4/2001 | Kim et al. | |
| 6,331,380 B1 | 12/2001 | Ye et al. | |
| 6,352,922 B1 | 3/2002 | Kim | |
| 6,355,560 B1 | 3/2002 | Mosely et al. | |
| 6,521,302 B1 | 2/2003 | Campana-Schmitt et al. | |
| 6,541,397 B1 | 4/2003 | Bencher et al. | |
| 6,573,030 B1 | 6/2003 | Fairbairn et al. | |
| 6,653,735 B1 | 11/2003 | Yang et al. | |
| 2002/0086547 A1 | 7/2002 | Mui et al. | |
| 2004/0023502 A1 | 2/2004 | Tzou et al. | |
| 2004/0038537 A1 | 2/2004 | Liu et al. | |
| 2004/0166691 A1 | 8/2004 | Nieh et al. | |
| 2004/0180551 A1 | 9/2004 | Biles et al. | |

FOREIGN PATENT DOCUMENTS

| | | |
|---|---|---|
| DE | 103 28 578 | 2/2004 |
| EP | 0 381 109 | 1/1990 |
| EP | 0 901 156 | 3/1999 |
| JP | 09 045633 | 2/1997 |
| JP | 11 026578 | 1/1999 |
| WO | WO 00/05763 | 2/2000 |

OTHER PUBLICATIONS

A. Helmbold et al., "Electrical Conductivity of Amorphous Hydrogenated Carbon", *Philosophical Magazines B.*, 1995, vol. 72, No. 3, pp. 335-350.

(Continued)

*Primary Examiner*—Carl Whitehead, Jr.
*Assistant Examiner*—Colleen E. Rodgers
(74) *Attorney, Agent, or Firm*—Patterson and Sheridan

(57) ABSTRACT

A method is provided for forming an amorphous carbon layer, deposited on a dielectric material such as oxide, nitride, silicon carbide, carbon doped oxide, etc., or a metal layer such as tungsten, aluminum or poly-silicon. The method includes the use of chamber seasoning, variable thickness of seasoning film, wider spacing, variable process gas flows, post-deposition purge with inert gas, and post-deposition plasma purge, among others, to make the deposition of an amorphous carbon film at low deposition temperatures possible without any defects or particle contamination.

18 Claims, 15 Drawing Sheets

OTHER PUBLICATIONS

Liu, et al., "Generating Sub-30nm Poly-Silicon Gates Using PECVD Amorphous Carbon as Hardmask and Anti-Reflective Coating", Proceedings of the SPIE, Bellingham, VA, US, vol. 5040, No. 1, Feb. 25, 2003, pp. 841-848.

PCT Notification of Transmittal of the International Search Report dated May 31, 2005 for PCT/US05/008070.

PCT Written Opinion dated May 31, 2005 for PCT/US05/008070.

METHODS FOR THE REDUCTION AND ELIMINATION OF PARTICULATE CONTAMINATION WITH CVD OF AMORPHOUS CARBON

BACKGROUND OF THE DISCLOSURE

1. Field of the Invention

The invention relates to the fabrication of integrated circuits and to a method for depositing a layer on a substrate and the structures formed by the layer.

2. Description of the Related Art

In the manufacture of integrated circuits, chemical vapor deposition processes are often used for deposition or etching of various material layers. Conventional thermal CVD processes supply reactive compounds to the substrate surface where heat-induced chemical reactions take place to produce a desired layer. Plasma enhanced chemical vapor deposition (PECVD) processes employ a power source (e.g., radio frequency (RF) power or microwave power) coupled to a deposition chamber to increase dissociation of the reactive compounds. Thus, PECVD processes allow deposition to be achieved at lower temperatures than those required for analogous thermal processes. This is advantageous for processes with stringent thermal budget demands, e.g., in very large scale or ultra-large scale integrated circuit (VLSI or ULSI) device fabrication.

The demands for greater integrated circuit densities also impose demands on the process sequences used for integrated circuit manufacture. For example, in process sequences using conventional lithographic techniques, a layer of energy sensitive resist is formed over a stack of material layers on a substrate. An image of a pattern is introduced into the energy sensitive resist layer. Thereafter, the pattern introduced into the energy sensitive resist layer is transferred into one or more layers of the material stack formed on the substrate using the layer of energy sensitive resist as a mask and a chemical etchant. The chemical etchant is designed to have a greater etch selectivity for the material layers of the stack than for the energy sensitive resist. That is, the chemical etchant etches the one or more layers of the material stack at a much faster rate than it etches the energy sensitive resist to prevent the energy sensitive resist material from being consumed prior to completion of the pattern transfer.

A hardmask can be over the exposed material stack to enhance patterning and etching of feature definitions in the material stack. The hardmask is resistive to damage and deformation. The hardmask protects the underlying material stack during subsequent material deposition and planarization or material removal processes, such as chemical mechanical polishing techniques or etching techniques, to reduce defect formation and feature deformation. The hardmask may then be removed following planarization prior to subsequent processing of the substrate.

One material of interest as a hardmask is amorphous carbon. Amorphous carbon has a low dielectric constant (i.e., k<4) and a sufficiently high resistance to removal from etching and polishing techniques for performing as a hardmask. The use of amorphous carbon in semiconductor processing is favorable because it provides good etch selectivity with oxides and metals and is also an anti-reflective coating (ARC) material at deep ultra-violet (DUV) wavelengths. In addition, it is easily stripped away after pattern transfer. Further, it enables gate lengths at less than 100 nm (e.g., less than 60 nm) and contact holes at less than 150 nm (e.g., less than 110 nm) with aspect ratios of more than 5:1 (e.g., more than 8:1).

When depositing an amorphous carbon film on a substrate at a lower deposition temperature, it was surprising to find carbon particles on the substrate surface, which are actually the reactive precursor compounds falling down or sticking onto the deposited carbon material. In contrast, the sources of particle contamination on a substrate for a typical deposition of a material layer typically come from degraded chamber wall, degraded chamber part components, degraded ceramics or metal parts, o-rings, and/or other film material before deposition.

As shown in FIG. 1, during the deposition of an amorphous carbon film on a substrate, it was unexpected to observe carbon particle contamination having a size of about 0.12 μm or larger or about 0.16 μm or larger at a deposition temperature of about 500° C. or lower, such as at around 400° C. or around 450° C. In contrast, at a deposition temperature around 550° C., no carbon particles are seen on the wafer. Therefore, as the processing temperature is decreased from about 550° C. to about 400° C., the number of particles resulting from the deposition increases. This is a problem when low temperature deposition is required to be suitable for various applications, such as aluminum applications.

The applications of using amorphous carbon as a hardmask are widened by adjusting the deposition parameters and thus the film property of the deposited amorphous carbon film. For example, it can be used in front end processing, such as polysilicon gate or oxide contact etch patterning. It can also be used for back end DRAM processing where the underlying material is aluminum, using a lower deposition temperature. However, particle contamination increases as processing parameters change. In addition, decreasing the deposition temperature decreases the absorbance of the film as shown in FIG. 2. FIG. 2 demonstrates the correlation between the deposition temperature and light absorption coefficient, k, of the deposited amorphous carbon film at two different light wavelengths of 248 nm (square dots) and 633 nm (diamond dots). In situations requiring a more transparent film, desired lower extinction coefficient (k) values for the absorbance of the film can be achieved by depositing at lower temperatures. This can be beneficial when performing wafer alignment in preparation for lithograthy because alignment marks may not be detectable if the carbon film is too absorbing. Also, in order to increase the deposition rate of amorphous carbon and thus the throughput of substrate processing, it is preferred to include a lower deposition temperature, as shown in FIG. 3. Thus, it is desired to develop a deposition process for amorphous carbon to reduce the particles generated on the surface of the substrate at a low deposition temperature.

SUMMARY OF THE INVENTION

Aspects of the invention generally provide a method for forming a material layer, such as an amorphous carbon layer, deposited on a dielectric material such as oxide, nitride, silicon carbide, carbon doped oxide, etc., or a metal layer such as tungsten, aluminum or poly-silicon with minimal defect formation and particle contamination. In one aspect, a method for processing a substrate in a chamber is provided. The method includes depositing a first material inside the chamber for a first deposition time, then positioning a substrate inside the chamber, and providing a gas mixture by flowing one or more hydrocarbon compounds and an inert gas to the deposition chamber. The method further includes applying an electric field to the gas mixture and heating the gas mixture to thermally decompose the one or more hydrocarbon compounds in the gas mixture and generate a plasma, and depositing a second material on the substrate for a second deposition time. Further, at least one gas flow of the one or more hydrocarbon compounds is terminated while still flowing the inert gas to the deposition chamber for a first time period and any gas or plasma generated is pumped out of the chamber for a second time period to reduce particle contamination on the substrate.

In another aspect of the invention, a method for processing a substrate includes positioning a substrate inside the chamber, providing a gas mixture by flowing one or more hydrocarbon compounds and an inert gas to the deposition chamber, applying an electric field to the gas mixture and heating the gas mixture to thermally decompose the one or more hydrocarbon compounds in the gas mixture and generate a plasma, and depositing a material on the substrate for a deposition time. The method further includes moving the substrate to a different distance from a gas distribution system of the chamber, terminating at least one gas flow of the one or more hydrocarbon compounds while still flowing the inert gas to the deposition chamber for a first time period, and pumping any gas or plasma generated out of the chamber for a second time period to reduce particle contamination on the substrate.

In still another aspect, a method for processing a substrate includes depositing a material on the substrate for a deposition time. The method further includes terminating at least one gas flow of one or more hydrocarbon compounds while still flowing the inert gas to the deposition chamber for a first time period and still applying the electric field, and pumping any gas or plasma generated out of the chamber for a second time period to reduce particle contamination on the substrate.

In still another aspect, a method for processing a substrate includes positioning a substrate inside the chamber, providing a gas mixture by flowing one or more hydrocarbon compounds and an inert gas to the deposition chamber, applying an electric field to the gas mixture and heating the gas mixture to thermally decompose the one or more hydrocarbon compounds in the gas mixture and generate a plasma. The method further includes depositing a material on the substrate for a deposition time and terminating the electric field applied to the gas mixture. In addition, at least one gas flow of the one or more hydrocarbon compounds is terminated while still flowing the inert gas to the deposition chamber for a first time period and still applying the electric field. Further, any gas or plasma generated is pumped out of the chamber for a second time period to reduce particle contamination on the substrate.

BRIEF DESCRIPTION OF THE DRAWINGS

So that the manner in which the above features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

For a further understanding of aspect of the invention, reference should be made to the ensuing detailed description. The words and phrases used herein should be given their ordinary and customary meaning in the art by one skilled in the art unless otherwise further defined.

DETAILED DESCRIPTION

Aspects of the invention generally provide a method for forming a material layer and removing particle contamination from the material layer, such as an amorphous carbon layer deposited on a dielectric material such as oxide, nitride, silicon carbide, carbon doped oxide, etc., or a metal layer such as tungsten, aluminum or poly-silicon. For example, an amorphous carbon layer is formed by thermally decomposing a gas mixture comprising a hydrocarbon compound and an inert gas. The gas mixture is introduced into a process chamber where plasma enhanced thermal decomposition of the hydrocarbon compound, in close proximity to the surface of a substrate, results in deposition of an amorphous carbon layer on the substrate surface. The amorphous carbon layer is compatible with integrated circuit fabrication processes. In one integrated circuit fabrication process, the amorphous carbon layer is used as a hardmask. The amorphous carbon layer is also suitable for use as an anti-reflective coating (ARC) at DUV wavelengths. Additionally, the pattern defined in the amorphous carbon hardmask can be incorporated into the structure of an integrated circuit, such as for example in a damascene structure.

In one embodiment, when an amorphous carbon layer is deposited at a lower deposition temperature, the amorphous carbon layer is deposited from a gas mixture having one or more hydrocarbon compounds, wherein the flow of the one or more hydrocarbon compounds into the processing chamber is terminated before the flow of the other components of the gas mixture into the chamber. This helps to reduce particle contamination without the need for additional process steps or complicated adjustments on the chamber hardware.

In another embodiment, a first material is deposited inside the chamber before a second material is deposited on the substrate to help reduce particle contamination. In still another embodiment, the substrate is moved such that it is located at a different distance from a gas distribution system of the chamber after the amorphous carbon layer is deposited on the substrate. In still another embodiment, after the amorphous carbon layer is deposited, the flow of the one or more hydrocarbon compounds into the processing chamber is terminated while the flow of the other components of the gas mixture and the RF power are continued.

Generally, one or more processing conditions are varied during the deposition of a material layer such that plasma-induced particle contamination to the substrate is reduced. This embodiment will be further described with respect to FIGS. 4–6.

Figure 1:
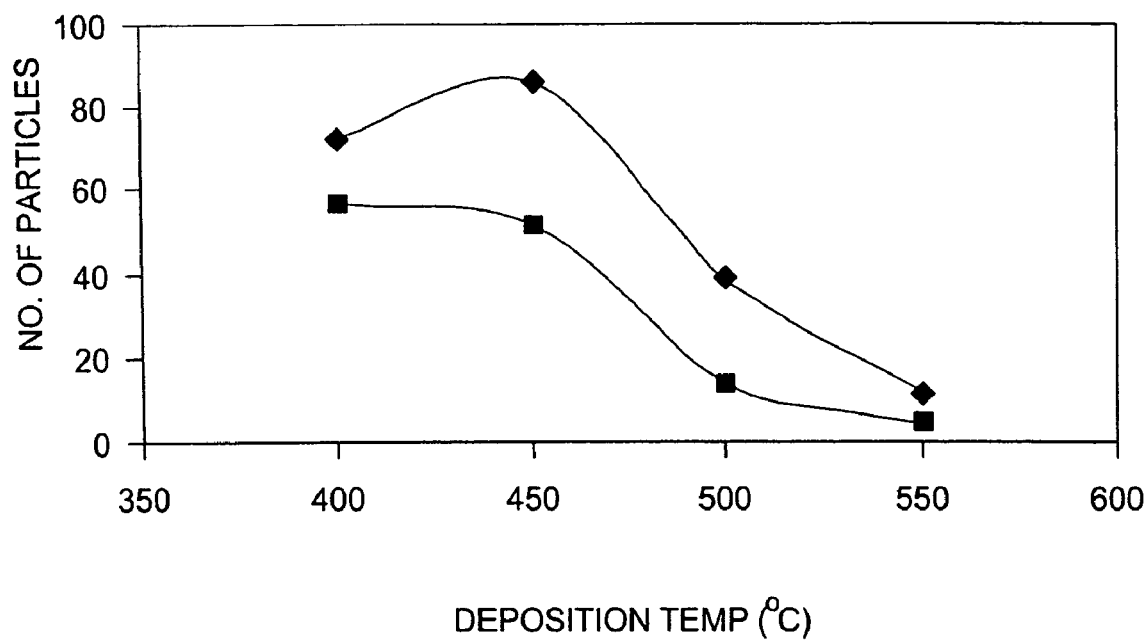
FIG. 1 illustrates the effect of temperature on particle contamination.
Figure 2:
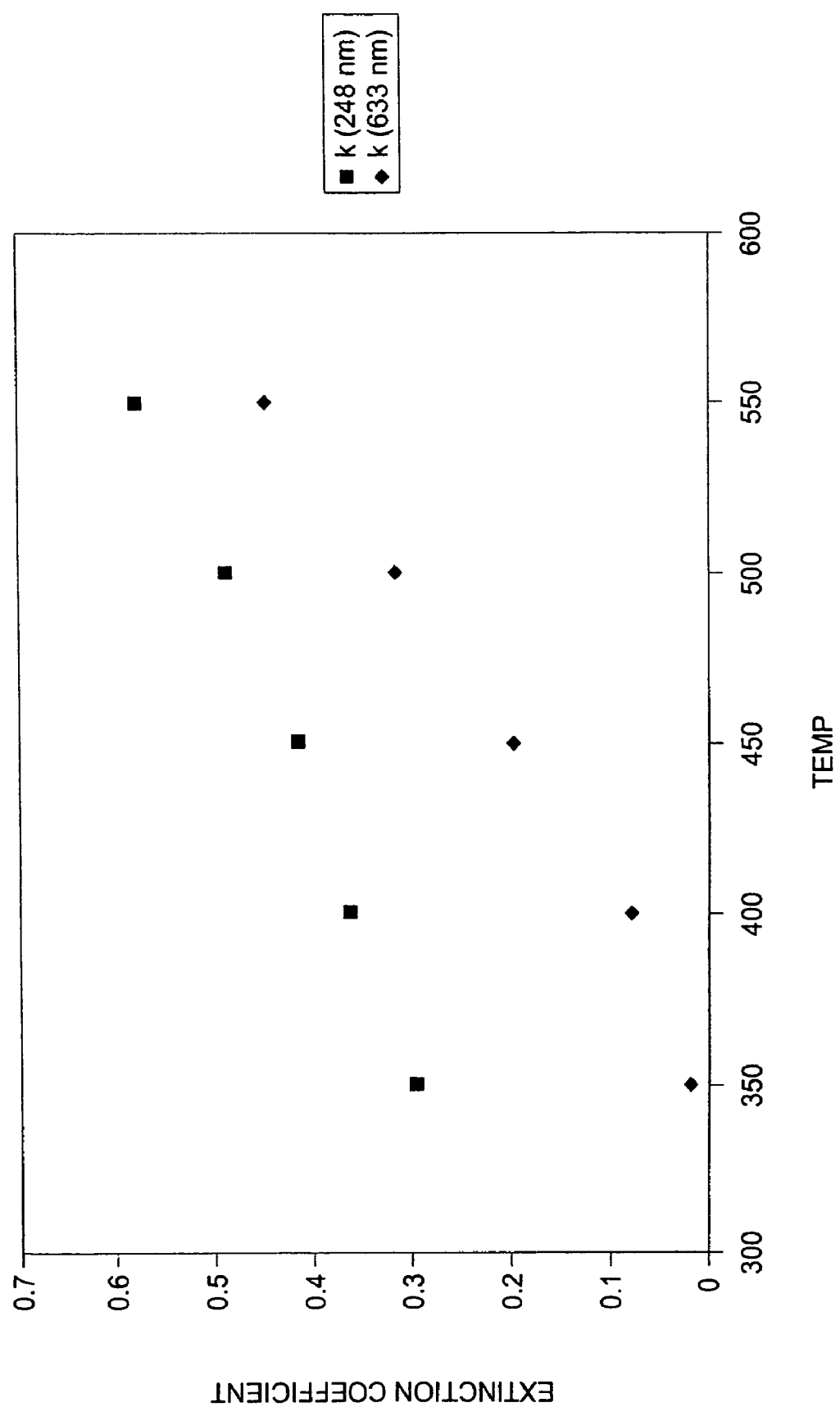
FIG. 2 illustrates the effect of temperature on extinction coefficient of film absorbance.
Figure 3:
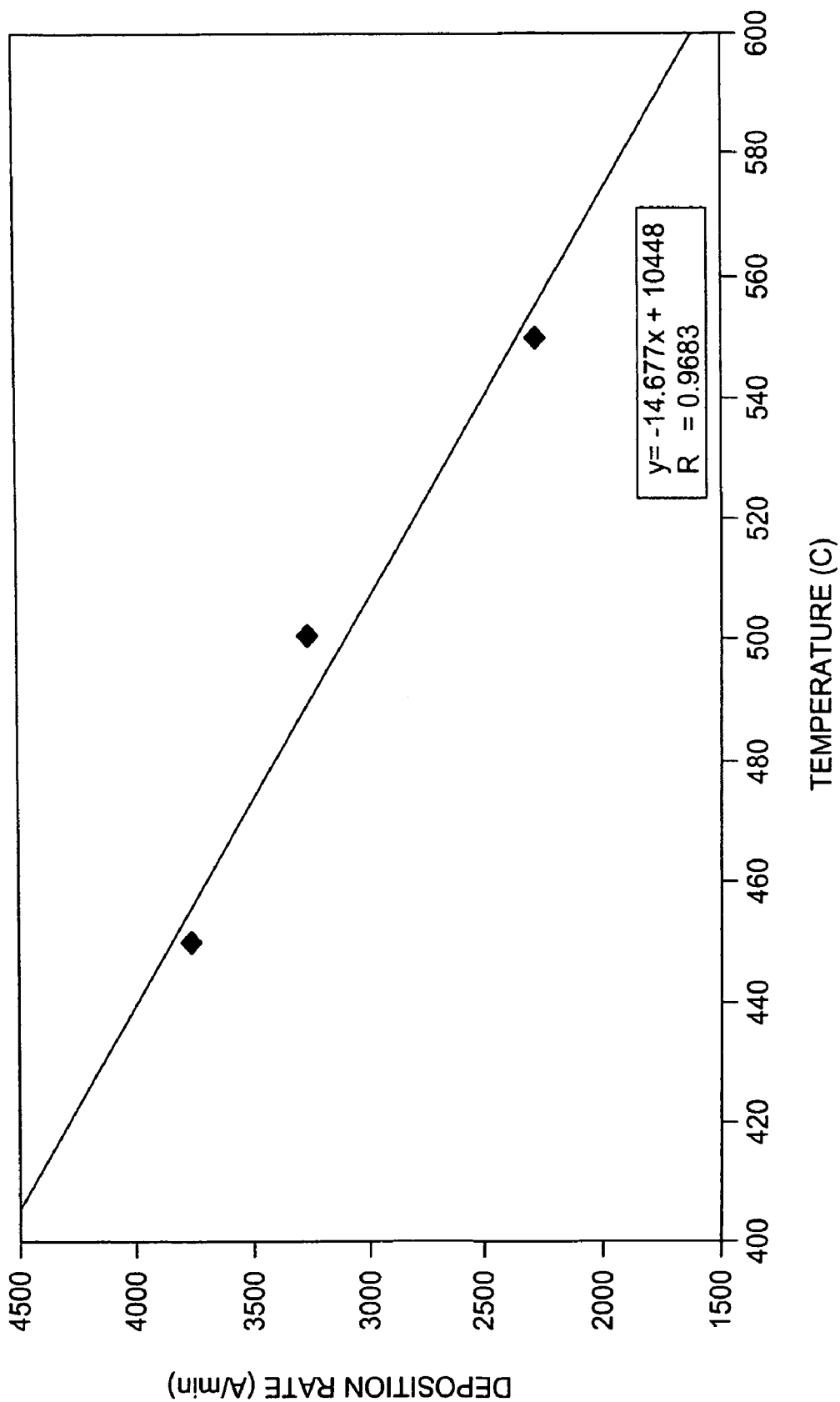
FIG. 3 illustrates the effect of temperature on deposition rate.
Figure 4:
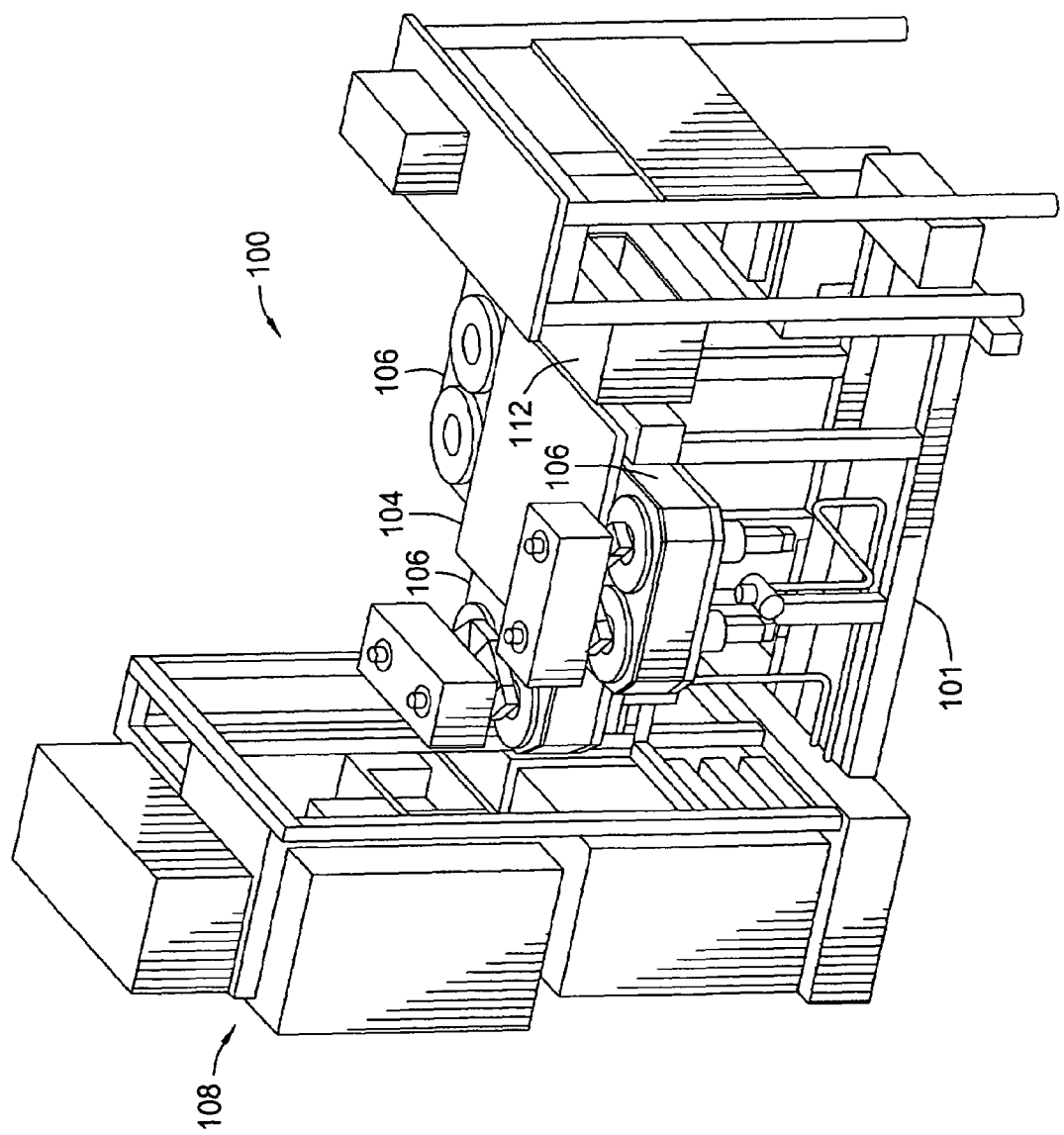
FIG. 4 is a perspective view of one embodiment of the vacuum processing system of the present invention.
Figure 5:
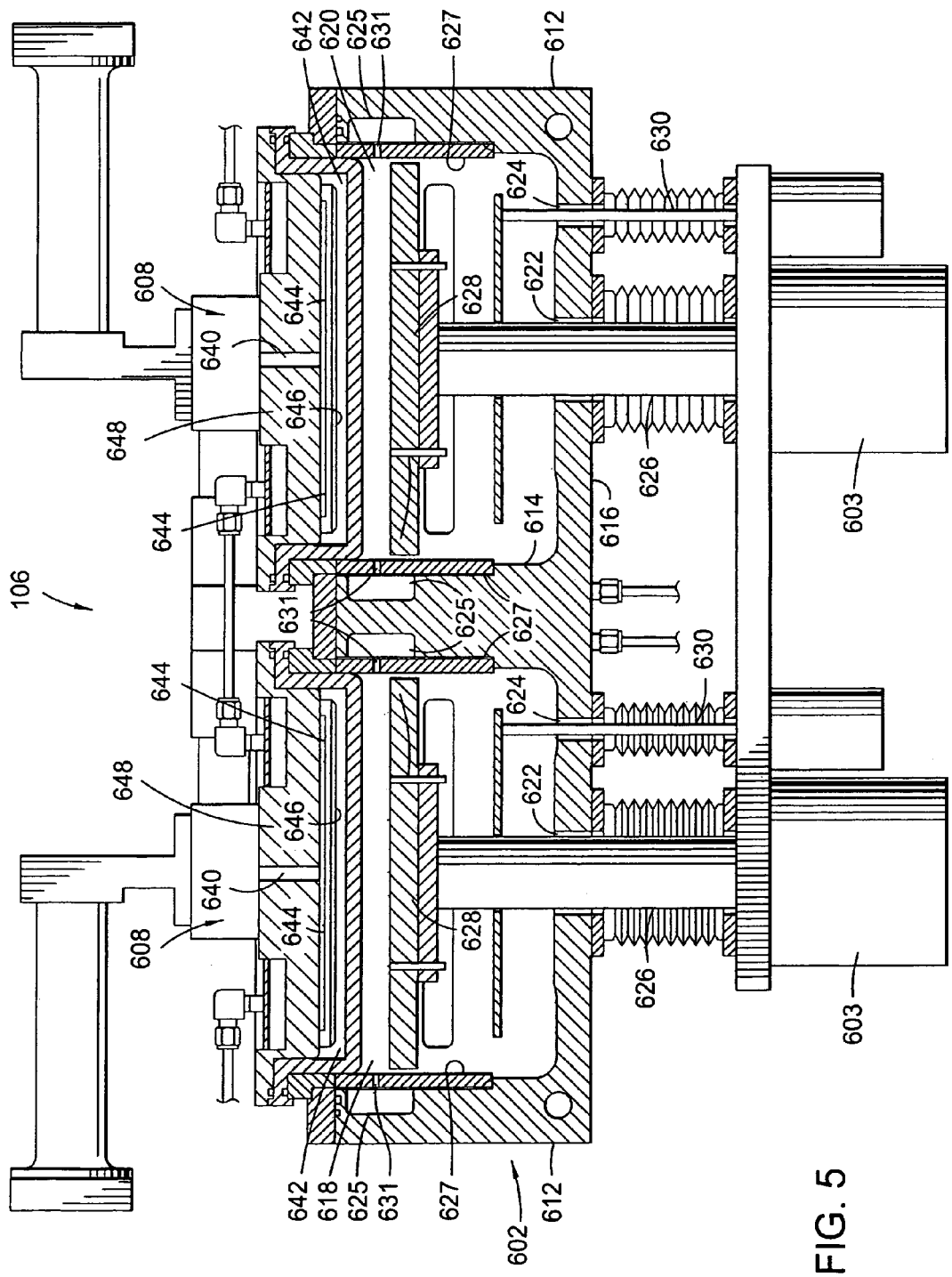
FIG. 5 is a cross sectional view of one embodiment of a processing chamber of the present invention.

FIG. 4 is a perspective view of a vacuum processing system that is suitable for practicing embodiments of the invention and FIG. 5 is a cross-sectional schematic view of a chemical vapor deposition (CVD) chamber 106 that is suitable for practicing embodiments of the invention. One example of such a chamber is a PRODUCER® dual chambers or a DxZ® chamber, used in a P-5000 mainframe or a CENTURA® platform, suitable for 200 mm, 300 mm, or larger size substrates, all of which are available from Applied Materials, Inc., of Santa Clara, Calif. In FIG. 4, the system 100 is a self-contained system supported on a main frame structure 101 where wafer cassettes are supported and wafers are loaded into and unloaded from a loadlock chamber 112, a transfer chamber 104 housing a wafer handler, a series of tandem process chambers 106 mounted on the transfer chamber 104 and a back end 108 which houses the support utilities needed for operation of the system 100, such as a gas panel, power distribution panel and power generators. The system can be adapted to accommodate various processes and supporting chamber hardware such as CVD, PVD and etch. The embodiment described below will be directed to a system employing a CVD process, such as plasma enhanced CVD processes, to deposit a material, such as an amorphous carbon material.

FIG. 5 shows a schematic cross-sectional view of the chamber 106 defining two processing regions 618, 620. Chamber body 602 includes chamber sidewall 612, chamber interior wall 614 and chamber bottom wall 616 which define the two processing regions 618, 620. The bottom wall 616 in each processing region 618, 620 defines at least two passages 622, 624 through which a stem 626 of a heater pedestal 628 and a rod 630 of a wafer lift pin assembly are disposed, respectively.

The chamber 106 also includes a gas distribution system 608, typically referred to as a "showerhead", for delivering gases into the processing regions 618, 620 through a gas inlet passage 640 into a shower head assembly 642 comprised of an annular base plate 648 having a blocker plate 644 disposed intermediate a face plate 646. A plurality of vertical gas passages are also included in the shower head assembly 642 for each reactant gas, carrier gas, and/or cleaning gas to be delivered into the chamber through the gas distribution system 608.

A heater pedestal 628 is movably disposed in each processing region 618, 620 by a stem 626 which is connected to a lift motor 603. The stem 626 moves upwardly and downwardly in the chamber to move the heater pedestal 628 to position a substrate (not shown) thereon or remove a substrate there from for processing. Gas flow controllers are typically used to control and regulate the flow rates of different process gases into the process chamber 106 through gas distribution system 608. Other flow control components may include a liquid flow injection valve and liquid flow controller (not shown) if liquid precursors are used. A substrate support is heated, such as by a heater having one or more resistive elements, and is mounted on the stem 626, so that the substrate support and the substrate can be controllably moved by a lift motor 603 between a lower loading/off-loading position and an upper processing position adjacent to the gas distribution system 608.

The chamber sidewall 612 and the chamber interior wall 614 define two cylindrical annular processing regions 618, 620. A circumferential pumping channel 625 is formed in the chamber walls for exhausting gases from the processing regions 618, 620 and controlling the pressure within each region 618, 620. A chamber liner or insert 627, preferably made of ceramic or the like, is disposed in each processing region 618, 620 to define the lateral boundary of each processing region and to protect the chamber sidewalls 612 and the chamber interior wall 614 from the corrosive processing environment and to maintain an electrically isolated plasma environment. A plurality of exhaust ports 631, or circumferential slots, are located about the periphery of the processing regions 618, 620 and disposed through each liner 627 to be in communication with the pumping channel 625 formed in the chamber walls and to achieve a desired pumping rate and uniformity. The number of ports and the height of the ports relative to the face plate of the gas distribution system are controlled to provide an optimal gas flow pattern over the wafer during processing.

A plasma is formed from one or more process gases or a gas mixture by applying an electric field from a power supply and heating the gas mixture, such as by the resistive heater element. The electric field is generated from coupling, such as inductively coupling or capacitively coupling, to the gas distribution system 608 with radio-frequency (RF) or microwave energy. In some cases, the gas distribution system 608 acts as an electrode. Film deposition takes place when the substrate is exposed to the plasma and the reactive gases provided therein. The substrate support and chamber walls are typically grounded. The power supply can supply either a single or mixed-frequency RF signal to the gas distribution system 608 to enhance the decomposition of any gases introduced into the chamber 106. When a single frequency RF signal is used, e.g., between about 350 kHz and about 60 MHz, a power of between about 1 and about 2,000 W can be applied to the gas distribution system 608.

A system controller controls the functions of various components such as the power supplies, lift motors, flow controllers for gas injection, vacuum pump, and other associated chamber and/or processing functions. The system controller executes system control software stored in a memory, which in the preferred embodiment is a hard disk drive, and can include analog and digital input/output boards, interface boards, and stepper motor controller boards. Optical and/or magnetic sensors are generally used to move and determine the position of movable mechanical assemblies. A similar system is disclosed in U.S. Pat. No. 5,855,681, entitled "Ultra High Throughput Wafer Vacuum Processing System," issued to Maydan et al., filed on Nov. 18, 1996, also in U.S. Pat. No. 6,152,070, entitled "Tandem Process Chamber," issued to Fairbairn et al., filed on Nov. 18, 1996. Both are assigned to Applied Materials, Inc., the assignee of the present invention. Another examples of such a CVD process chamber is described in U.S. Pat. No. 5,000,113, entitled "Thermal CVD/PECVD Reactor and Use for Thermal Chemical Vapor Deposition of Silicon Dioxide and In-situ Multi-step Planarized Process," issued to Wang et al., and in U.S. Pat. No. 6,355,560, entitled "Low Temperature Integrated Metallization Process and Apparatus," issued to Mosely et al. and assigned to Applied Materials, Inc. The aforementioned patents are hereby incorporated by reference to the extent not inconsistent with the disclosure herein. The above CVD system description is mainly for illustrative purposes, and other plasma processing chambers may also be employed for practicing embodiments of the invention.

Figure 6:
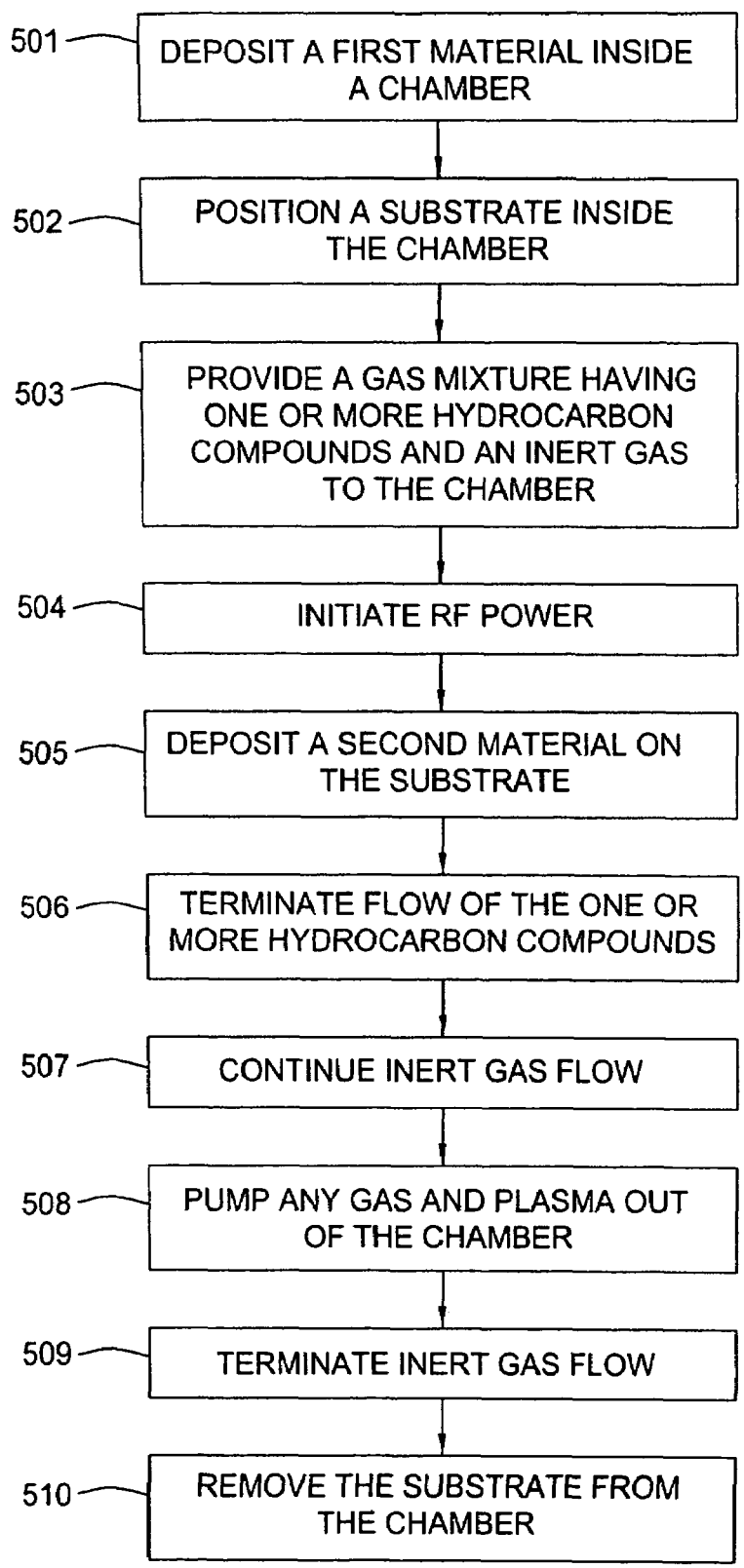
FIG. 6 is a process flow diagram illustrating a first method incorporating one embodiment of the invention.

FIG. 6 is a process flow diagram illustrating a first embodiment of the invention. At step 501, a first material is deposited inside a chamber for a first deposition time, such as about 1 second or larger. Preferably, the first deposition time is between about 5 seconds to about 30 seconds, such as about 10 seconds. At step 502, a substrate for depositing a second material thereon is positioned on a substrate support inside the chamber. In one embodiment, the first material may be the same material as the second material that is deposited on the substrate. It was found that the deposition of the first material inside the chamber before the second material is deposited on the substrate reduces the number of particles contaminating on the substrate surface, as compared to no deposition of the first material, as described in detail also in Examples.

At step 503, a gas mixture is introduced into the chamber. The gas mixture may include various process gas precursors for depositing a second material (e.g., an amorphous carbon material), various carrier gases, and inert gases. In one embodiment, the gas mixture includes one or more hydrocarbon compounds and an inert gas. At step 504, RF power is initiated in the chamber in order to provide plasma processing conditions in the chamber. The gas mixture is reacted in the chamber in the presence of RF power to deposit the second material on the substrate at step 505 for a second deposition time, such as about 5 second or more. Preferably, the second deposition time is between about 5 seconds or longer, such as about 60 seconds. In one embodiment, the first deposition time is shorter than the second deposition time.

At step 506, the flow of one or more process gas precursors is terminated. For example, the flow of one or more hydrocarbon compounds is terminated. It is contemplated that, in one embodiment, by terminating the flow of the one or more hydrocarbon compounds immediately after the second material is deposited on the substrate, the source of the particle contamination, the one or more hydrocarbon compounds, is reduced inside the chamber, thereby reducing the chance for particles to fall down onto the substrate surface.

At step 507, other gas flow in the gas mixture is maintained for a first time period. For example, the flow of a carrier gas or an inert gas is continued to help purge particles, such as carbon particles, away from the substrate surface. The first time period for maintaining the flow of the inert gas, such as a helium gas, is about 1 second or larger. Preferably, the first time period for inert gas purge is between about 1 second to about 1 minute, such as between about 5 seconds to about 180 seconds, e.g., a first time period of about 5 seconds to about 10 seconds.

At step 508, any particles, contamination, gas, such as precursor-containing gas, carrier gas, inert gas, or plasma remained inside the chamber, is pumped out of the chamber for a second time period, before the remaining gas flow from the gas mixture is terminated at step 509, for example, before the flow of the inert gas is terminated. The second time period for pumping contamination, gas, or plasma is about 1 second or larger. Preferably, the second time period is between about 1 second to about 3 minutes, such as between about 5 seconds to about 60 seconds, e.g., a second time period of about 10 seconds. In one embodiment, the first time period is the same as the second time period. In another embodiment, the first time period shorter than the second time period. At step 510, the substrate is removed from the chamber, for example, by opening a chamber slit valve.

Although FIG. 6 includes two steps, 501 and 506, in which a first material is deposited inside the chamber before a second material is deposited on the substrate, and one or more process gas flows is terminated, in other embodiments, only one of steps 501 and 506 is performed. For example, a carbon film may be deposited shortly after in-situ oxygen plasma cleaning to reduce carbon particle contamination in the later substrate deposition step regardless of whether or not one or more process gas flow is terminated during the process sequence. The deposition of this carbon film takes place without the presence of the substrate for a short first deposition time, such as about 1 second or longer, e.g., between about 5 seconds to about 10 seconds. The carbon film is generally deposited on chamber walls, face plate, etc. The substrate is not placed in the chamber until after this first deposition time to ensure that the substrate is under the same condition before and after it goes into the chamber.

The mechanism by which carbon particle contamination increases at lower deposition temperatures is not clear. It is hypothesized that gas phase nucleation of reactive carbon and hydrogen containing fragments undergoes an effect called thermophoresis at different deposition temperatures. In general, particles move from a hotter to a colder region in a temperature gradient. By heating a surface sufficiently, a thermophoretic force is generated that is sufficient to overpower gravitational, electrostatic, and convectional forces.

When the heater near the substrate support is set at a higher temperature, e.g., at 550° C., the rest of the chamber walls and plasma are much colder; so there is a very strong temperature gradient in the gas/plasma inside the chamber to help keep the particles away from the substrate surface, strong enough to keep particles of a certain size from depositing on a hotter surface.

When deposition takes place at a lower temperature, e.g., at 400° C., the temperature gradient inside the chamber is no longer big enough and contamination such as some of the carbon particles may fall down on top of the substrate. It is believed that, at 400° C., the temperature gradient created between the heated substrate and the gas/plasma phase is insufficient to prevent the movement of particles created in the plasma phase onto the substrate surface.

Other possible mechanisms that relate to the amount of particles deposited are the quality of the first material deposited inside the chamber before the substrate is positioned in the chamber. In addition, contamination can also stick onto the substrate by electrostatic force.

Figure 7:
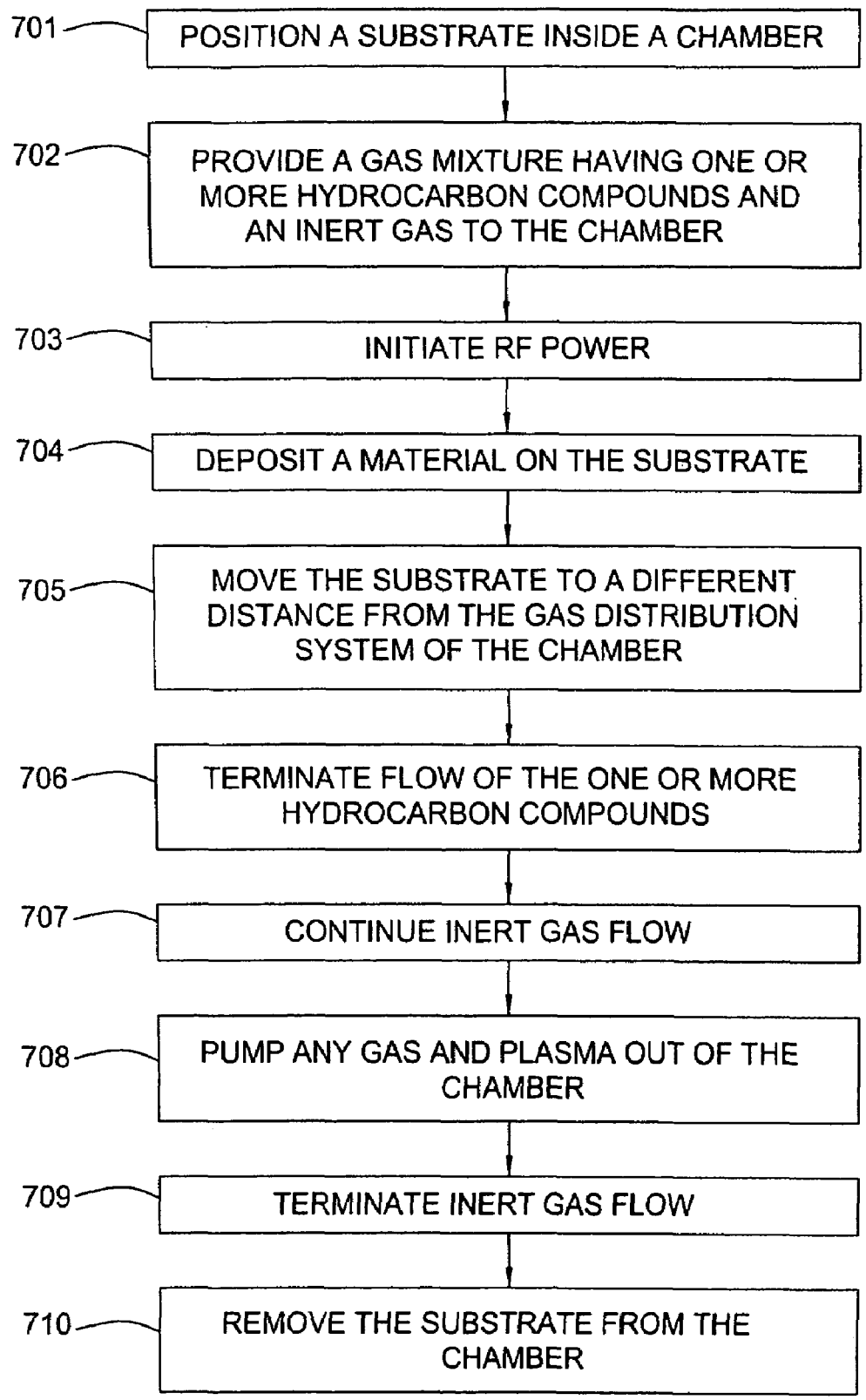
FIG. 7 is a process flow diagram illustrating a second method incorporating one embodiment of the invention.

FIG. 7 is a flow diagram of a second embodiment of the invention that may be performed using a processing chamber such as the processing chamber shown in FIG. 4. In the embodiment shown in FIG. 7, the amorphous carbon layer is deposited, and any contamination, gas, or plasma is pumped out of the chamber.

At step 701, a substrate is positioned on a substrate support in a processing chamber. At step 702, a gas mixture, such as a mixture of one or more hydrocarbon compounds and an inert gas, is introduced into the chamber. At step 703, RF power is initiated in the chamber in order to provide plasma processing conditions in the chamber. At step 704, a material, such as an amorphous carbon material, is deposited on the substrate for a deposition time of between about 5 seconds or longer, such as about 60 seconds.

At step 705, the substrate is moved to a different distance from the gas distribution system of the chamber. In one embodiment, the substrate is moved to a different distance from the gas distribution system than the substrate position at step 704 to prevent particle contamination on the substrate. In another embodiment, the substrate is moved by the lift motor 603 to a position close to the exhaust port 631 in communication with the pumping channel 625. In still another embodiment, the substrate is moved by the lift motor 603 to a lower loading/off-loading position.

At step 706, the flow of the one or more hydrocarbon compounds is terminated, while the inert gas flow is continued at step 707 for a first time period of 1 second or longer, such as between about 5 seconds to about 60 seconds, such as about 20 seconds. At step 708, the gas exhaust pump is turned on for a second time period of 1 second or longer, such as between about 5 seconds to about 120 seconds, such as about 30 seconds, to pump any gas or plasma out of the chamber. In one embodiment, the first time period is the same as the second time period. In another embodiment, the second embodiment is longer than the second embodiment. At step 709, flow of the remaining component of the gas mixture is terminated. For example, the inert gas is terminated, and the substrate is ready to be removed from the chamber at step 710.

Figure 8:
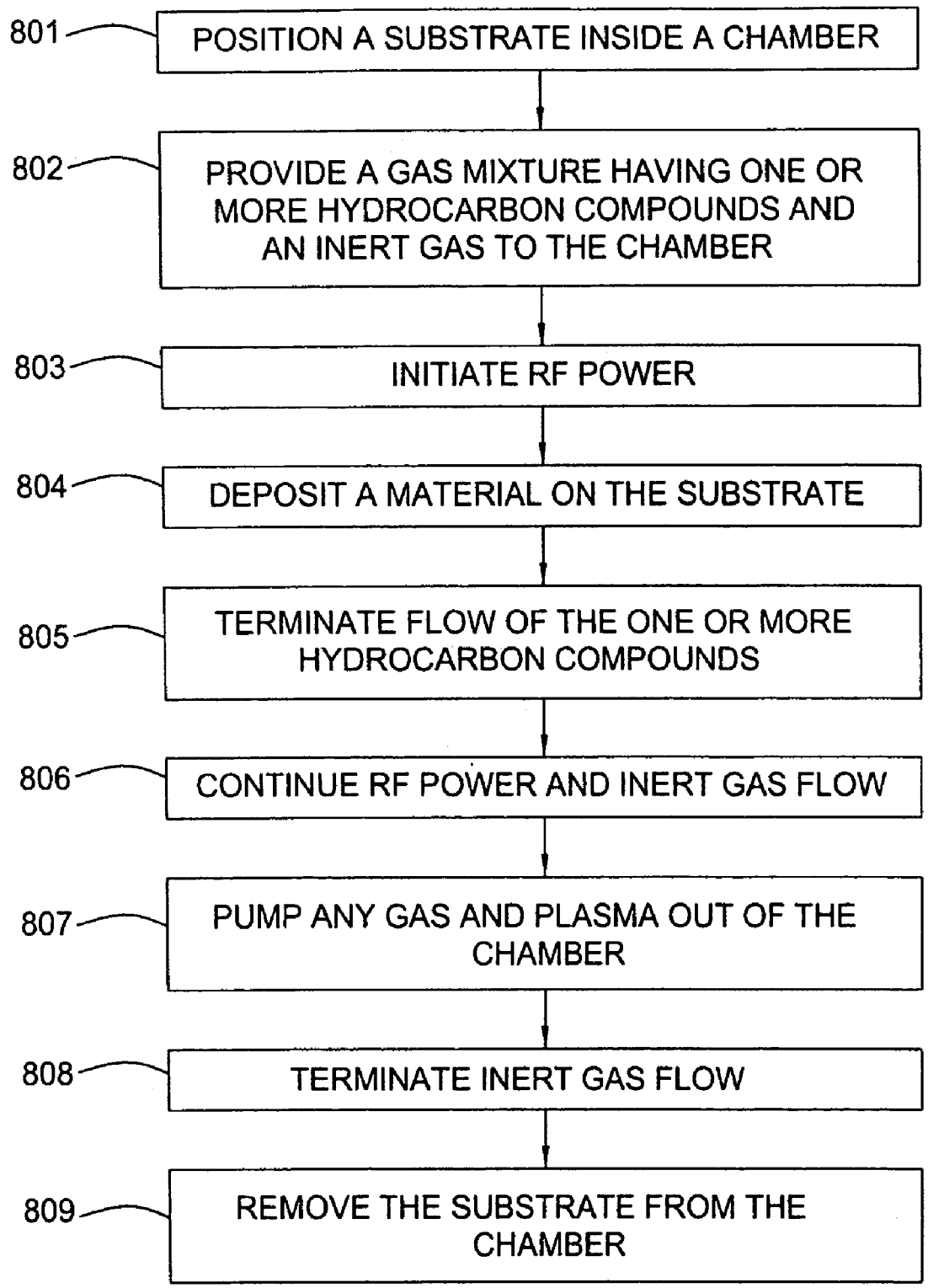
FIG. 8 is a process flow diagram illustrating a third method incorporating one embodiment of the invention.

FIG. 8 is a flow diagram of a third embodiment of the invention. In the embodiment shown in FIG. 8, the amorphous carbon layer is deposited, wherein the flow of the one or more hydrocarbon compounds into the processing chamber is terminated while both the flow of the other components of the gas mixture into the chamber and the RF power are continued.

At step 801, a substrate is positioned on a substrate support in a processing chamber. At step 802, a gas mixture, such as a mixture of one or more hydrocarbon compounds and an inert gas, is introduced into the chamber and the RF power is initiated at step 803. At step 804, a material, such as an amorphous carbon material, is deposited on the substrate for a deposition time of between about 5 seconds or longer, such as about 60 seconds. At step 805, the flow of the one or more hydrocarbon compounds is terminated, while the inert gas flow and the RF power are continued at step 806 for a first time period of 1 second or longer. The flow of the inert gas flow in the presence of the RF power can help to reduce particle contamination on the substrate. At step 807, any gas, plasma, and particles are pumped out of the chamber, pumping for a second time period of about 1 second or longer. At step 808, the remaining components of the gas mixture, the RF power, the inert gas flow are terminated before the substrate is removed from the chamber at step 809.

The combination of the steps of FIGS. 7 and 8 provides another embodiment of the invention. A substrate is positioned on a substrate support in a processing chamber, a gas mixture is introduced into the processing chamber, RF power is initiated in the processing chamber to provide plasma processing conditions in the chamber, and the gas mixture having one or more hydrocarbon compounds and an inert gas is reacted in the chamber in the presence of RF power to deposit an amorphous layer on the substrate for a deposition time. Then, the substrate is moved to a different distance from the gas distribution system of the chamber and the flow of the one or more hydrocarbon compounds into the chamber is terminated, as shown in steps 701–706 of FIG. 7. In addition, the inert gas flow and the RF power are continued for a first time period of 1 second or longer, and any gas, plasma, and particles are pumped out of the chamber before the substrate is removed from the chamber, as shown in steps 806–809 of FIG. 8.

Figure 9:
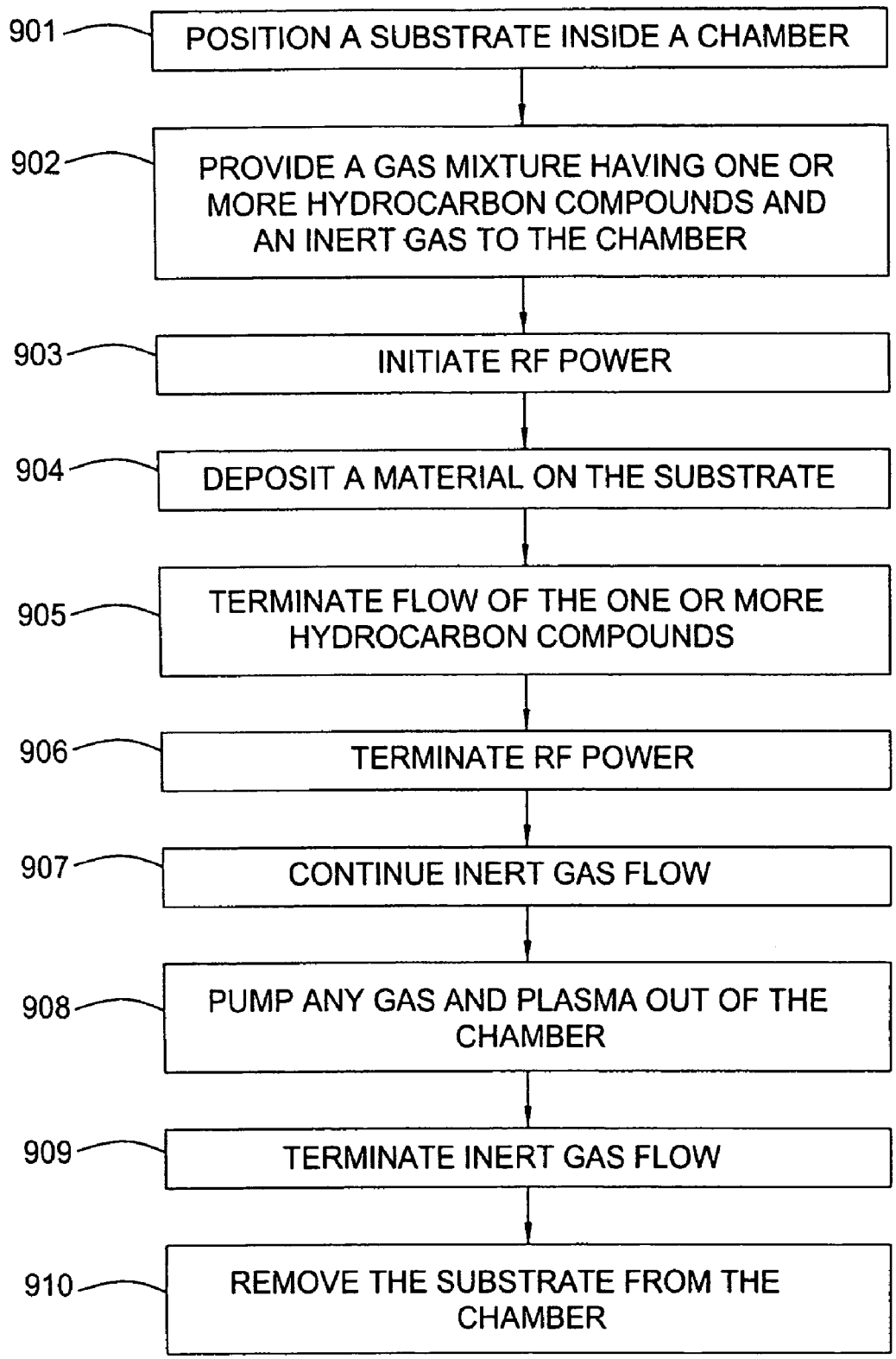
FIG. 9 is a process flow diagram illustrating a fourth method incorporating one embodiment of the invention.

FIG. 9 is a flow diagram of another embodiment of the invention. In the embodiment shown in FIG. 9, the amorphous carbon layer is deposited, wherein the flow of the one or more hydrocarbon compounds into the processing chamber and the RF power are terminated while the flow of the other components of the gas mixture into the chamber is remained.

At step 901, a substrate is positioned on a substrate support in a processing chamber. At step 902, a gas mixture, such as a mixture of one or more hydrocarbon compounds and an inert gas, is introduced into the chamber and the RF power is initiated at step 903. At step 904, a material, such as an amorphous carbon material, is deposited on the substrate for a deposition time. At step 905, the flow of the one or more hydrocarbon compounds is terminated. At step 906, the RF power is terminated, while the inert gas flow is continued at step 907 for a first time period of 1 second or longer. The flow of the inert gas flow can help to reduce particle contamination on the substrate. At step 908, any gas, plasma, and particles are pumped out of the chamber for a second time period of 1 second or longer. At step 909, the remaining components of the gas mixture and the inert gas flow are terminated before the substrate is removed from the chamber at step 910.

The combination of the steps of FIGS. 7 and 9 provides another embodiment of the invention. A substrate is positioned on a substrate support in a processing chamber, a gas mixture is introduced into the processing chamber, RF power is initiated in the processing chamber to provide plasma processing conditions in the chamber, and the gas mixture having one or more hydrocarbon compounds and an inert gas is reacted in the chamber in the presence of RF power for a deposition time of 1 second or longer to deposit an amorphous layer on the substrate. Then, the substrate is moved to a different distance from the gas distribution system of the chamber, as shown in steps 701–705 of FIG. 7. In addition, the flow of the one or more hydrocarbon compounds into the chamber and the RF power are terminated, while the inert gas flow is continued for a first time period, and any gas, plasma, and particles are pumped out of the chamber for a second time period before the substrate is removed from the chamber, as shown in steps 905–907 of FIG. 9. Other embodiments include combinations of the steps of FIG. 6 and any of FIGS. 7–9 to include deposition of a first material inside the chamber before a second material is deposited n the substrate surface.

In FIGS. 6–9, additional steps may be included. For example, the chamber may be cleaned with a plasma by supplying one or more cleaning gases and applying an electric field from an RF power source or microwave power source. The cleaning gases may include, but are not limited to, oxygen-containing gas (e.g., oxygen, carbon dioxide), hydrogen-containing gas (e.g., hydrogen gas), nitrogen-containing gas (e.g., ammonium, nitrous oxide), helium, argon, among others. Examples of hydrogen-containing gas include, but are not limited to, hydrogen gas ($H_2$) and ammonium ($NH_3$), among others. In one embodiment, when the chamber is cleaned by a plasma generated from a cleaning gas, the cleaning gas may optionally be delivered with a carrier gas and supplied into the chamber. Exemplary carrier gas includes inert gases, such as helium and argon, among others. In another embodiment, an in-situ oxygen plasma is generated to clean away any material inside the chamber, such as material on the chamber walls, face plate, everywhere, after previous substrate processing and substrate removal.

While the methods of reducing particle contamination described above each include varying one process variable during the deposition of an amorphous carbon layer, such as depositing a carbon film inside the chamber before the amorphous carbon layer is deposited on the substrate, the distance between the substrate and the gas distribution system, the timing of the termination of the flow of the one or more hydrocarbon compounds into the chamber, the timing of the termination of the flow of the inert gas into the chamber, the timing of the termination of the flow of the RF power into the chamber, further embodiments include varying more than one of these variables, not necessarily in the same order as illustrated in FIGS. 6–9.

In one example, both deposition of the carbon film inside the chamber before the amorphous carbon layer is deposited on the substrate and alteration of the distance between the substrate and the gas distribution system are required. In another example, deposition of the carbon film inside the chamber before the amorphous carbon layer is deposited on the substrate is required and timing of the termination of the RF power into the chamber is altered. In still another example, deposition of the carbon film inside the chamber before the amorphous carbon layer is deposited on the substrate and alteration of the distance between the substrate and the gas distribution system are required, and the timing of the termination of the flow of the one or more hydrocarbon compounds and the flow of the inert gas and termination of the RF power into the chamber are all altered.

For example, a substrate is positioned on a substrate support in a processing chamber, RF power is initiated in the chamber in order to provide plasma processing conditions in the chamber, a gas mixture having one or more hydrocarbon compounds and an inert gas is reacted in the chamber in the presence of RF power to deposit an amorphous carbon layer on the substrate, and the flow of the one or more hydrocarbon compounds into the chamber is terminated, while the flow of the inert gas is continued. Then the substrate is moved to a different distance from the gas distribution system and the RF power and the flow of the rest of the gas mixture into the chamber are terminated. Thereafter, pumping of any gas or plasma is initiated to pump any particle contamination out of the chamber before the inert gas flow is terminated and the substrate is removed out of the chamber.

In other embodiments, in addition to varying the distance between the substrate and the gas distribution system and/or varying the timing of the initiation or termination of the flow of the one or more hydrocarbon compounds into the chamber, a method of depositing an amorphous carbon layer on a substrate such that particle contamination to the substrate is minimized includes deposition of the carbon film inside the chamber before the amorphous carbon layer is deposited on the substrate, and varying the timing of the flow of the inert gas and the initiation and/or termination of the RF power.

For example, a carbon film is deposited inside the chamber before a substrate is positioned on a substrate support in a processing chamber, RF power is initiated in the chamber in order to provide plasma processing conditions in the chamber, a gas mixture having one or more hydrocarbon compounds and an inert gas is reacted in the chamber in the presence of RF power to deposit an amorphous carbon layer on the substrate. After deposition of the amorphous carbon layer on the substrate, the flow of the one or more hydrocarbon compounds into the chamber is terminated, and then the substrate is moved such that it is located at a different distance from a gas distribution system of the chamber. Then, the flow of the inert gas is continued while pumping of any gas or plasma is initiated to pump any particle contamination out of the chamber. Shortly after, particle contamination is pumped out, the inert gas flow is terminated and the substrate is removed out of the chamber.

Precursors and Processing Conditions for Deposition of an Amorphous Carbon Layer In any of the embodiments described herein, an amorphous carbon layer is deposited from a gas mixture having one or more hydrocarbon compounds and an inert gas. The amorphous carbon layer may be used as hardmask. The hardmask may be used at different levels within a device and for different metal applications. The hardmask layer can have a dielectric layer or a metal layer as an underlying layer.

A wide variety of gas mixtures may be used to deposit the amorphous carbon layer, and non-limiting examples of such gas mixtures are provided below. Generally, the gas mixture may include one or more hydrocarbon compounds and an inert gas. Suitable organic hydrocarbon compounds include aliphatic organic compounds, cyclic organic compounds, or combinations thereof. Aliphatic organic compounds have linear or branched structures comprising one or more carbon atoms. Organic hydrocarbon compounds contain carbon atoms in organic groups. Organic groups may include alkyl, alkenyl, alkynyl, cyclohexenyl, and aryl groups in addition to functional derivatives thereof.

For example, the hydrocarbon compound can have a formula $C_xH_y$, where x has a range of between 1 and 8 and y has a range of between 2 and 18, including, but not limited to, methane ($CH_4$), ethane ($C_2H_6$), ethene ($C_2H_4$), propylene ($C_3H_6$), propyne ($C_3H_4$), propane ($C_3H_8$), butane ($C_4H_{10}$), butylene ($C_4H_8$), butadiene ($C_4H_6$), acetylene ($C_2H_2$), benzene ($C_6H_6$), toluene ($C_7H_8$), and combinations thereof. Alternatively, partially or completely fluorinated derivatives of the hydrocarbon compounds, for example, $C_3F_8$ or $C_4F_8$, may be used to deposit a fluorinated amorphous carbon layer, which may be described as an amorphous fluorocarbon layer. A combination of hydrocarbon compounds and fluorinated derivatives of hydrocarbon compounds may be used to deposit the amorphous carbon layer or amorphous fluorocarbon layer.

Similarly, a variety of gases such as hydrogen ($H_2$), nitrogen ($N_2$), ammonia ($NH_3$), neon, xenon, krypton, or combinations thereof, among others, may be added to the gas mixture to modify properties of the amorphous carbon material. Argon, helium, and nitrogen are used to control the density and deposition rate of the amorphous carbon layer. The addition of $H_2$ and/or $NH_3$ can be used to control the hydrogen ratio of the amorphous carbon layer to control layer properties, such as reflectivity.

A preferred amorphous carbon layer is deposited in one embodiment by supplying propylene or propane to a plasma processing chamber at a flow rate between about 200 standard cubic centimeters per minute (sccm) and about 5000 sccm. An inert gas, such as helium, argon, or combinations thereof, is also supplied to the chamber at a flow rate between about 200 sccm and about 5000 sccm. The chamber pressure is maintained between about 100 milliTorr and about 20 Torr.

The gas mixture is introduced to the processing chamber via a gas distribution system spaced between about 180 mils and about 2000 mils from the substrate on which the amorphous carbon layer is being deposited upon. Power from a single 13.56 MHz RF power source is sup plied to the chamber 106 to form the plasma at a power density between about 0.14 watts/cm$^2$ and about 8.6 Watts/cm$^2$, or a power level between about 100 watts and about 6000 watts for a 300 mm substrate. A power density between about 0.9 watts/cm$^2$ and about 2.8 watts/cm$^2$, or a power level between about 600 watts and about 2000 watts for a 300 mm substrate, is preferably supplied to the processing chamber to generate the plasma. During deposition of the amorphous carbon layer, the substrate is maintained at a temperature between about −20° C. and about 550° C., and preferably is maintained at a temperature between about 350° C. and about 450° C. The RF power is provided at a frequency between about 0.01 MHz and 300 MHz. The RF power may be provided continuously or in short duration cycles. RF power is coupled to the deposition chamber to increase dissociation of the compounds. The compounds may also be dissociated in a microwave chamber prior to entering the deposition chamber. However, it should be noted that the respective parameters may be modified to perform the plasma processes in various chambers and for different substrate sizes, such as 200 mm substrates, among others.

The above process parameters provide a typical deposition rate for the amorphous carbon layer in the range of about 100 Å/min to about 4500 Å/min and can be implemented on a 300 mm substrate in a deposition chamber, such as the Producer SE system or the DxZ™ processing chamber, commercially available from Applied Materials, Inc. The applied RF power may be varied based upon the substrate size and the equipment used, for example, the applied RF power may be between about 0.9 watts/cm$^2$ and about 2.8 watts/cm$^2$. The amorphous carbon deposition values provided herein are illustrative and should not be construed as limiting the scope of the invention.

The amorphous carbon layer comprises carbon and hydrogen atoms, which may be an adjustable carbon:hydrogen ratio that ranges from about 10% hydrogen to about 60% hydrogen. Controlling the hydrogen ratio of the amorphous carbon layer is desirable for tuning the respective optical properties, etch selectivity and chemical mechanical polishing resistance properties. Specifically, as the hydrogen content decreases the optical properties of the as-deposited layer such as for example, the index of refraction (n) and the absorption coefficient (k) increase. Similarly, as the hydrogen content decreases the etch resistance of the amorphous carbon layer increases.

The light absorption coefficient, k, of the amorphous carbon layer can be varied between about 0.1 to about 1.0 at wavelengths below about 250 nm, such as between about 193 nm and about 250 nm, making the amorphous carbon layer suitable for use as an anti-reflective coating (ARC) at deep ultra-violet (DUV) wavelengths. The absorption coefficient of the amorphous carbon layer can be varied as a function of the deposition temperature. In particular, as the temperature increases the absorption coefficient of the as-deposited layer likewise increases. For example, when propylene is the hydrocarbon compound, the k value for the as-deposited amorphous carbon layers can be increased from about 0.2 to about 0.7 by increasing the deposition temperature from about 150° C. to about 480° C.

The absorption coefficient of the amorphous carbon layer can also be varied as a function of the additive used in the gas mixture. In particular, the presence of hydrogen ($H_2$), ammonia ($NH_3$), and nitrogen ($N_2$), or combinations thereof, in the gas mixture can increase the k value by about 10% to about 100%. The amorphous carbon layer is further described in U.S. patent application Ser. No. 09/590,322, filed on Jun. 8, 2000, entitled, "Method for Depositing an Amorphous Carbon Layer", which is incorporated herein to the extent not inconsistent with the claimed aspects and description herein.

EXAMPLES

The following examples illustrate embodiments of the present invention. The amorphous carbon layer was deposited using a chemical vapor deposition chamber that is part of an integrated processing platform. In particular, the films were deposited on a 300 mm PRODUCER SE® system, available from Applied Materials, Inc. of Santa Clara, Calif.

Example 1

The chamber was pre-cleaned with an in-situ oxygen plasma by supplying an oxygen gas and initiating a RF power. A carbon film was then deposited inside the chamber at about 400° C. for a time period of 0, 5, 7, 10, 20, 30 seconds, or longer. This film is also called seasoning film. A substrate is loaded onto the substrate support of the chamber and an amorphous carbon layer was deposited on the substrate from a gas mixture of propylene and helium, having a chamber pressure of about 5.75 Torr and a substrate temperature of about 400° C. The substrate was positioned 250 mils from the gas distribution manifold, and RF power of 2.5 W/cm$^2$ (1600 W) at a frequency of 13.56 MHz was applied to the manifold. The gas mixture described above was introduced into the chamber before the initiation of RF power. After the amorphous carbon layer was deposited on the substrate, the RF power and flow of the gas mixture were terminated. The chamber slit valve was opened to allow the gas mixture to be pumped out of the chamber. The numbers of the particles on the substrate were measured to see the effect of the deposition of the carbon film and the time period (thus, the thickness of the carbon film) on particle contamination.

Figure 10:
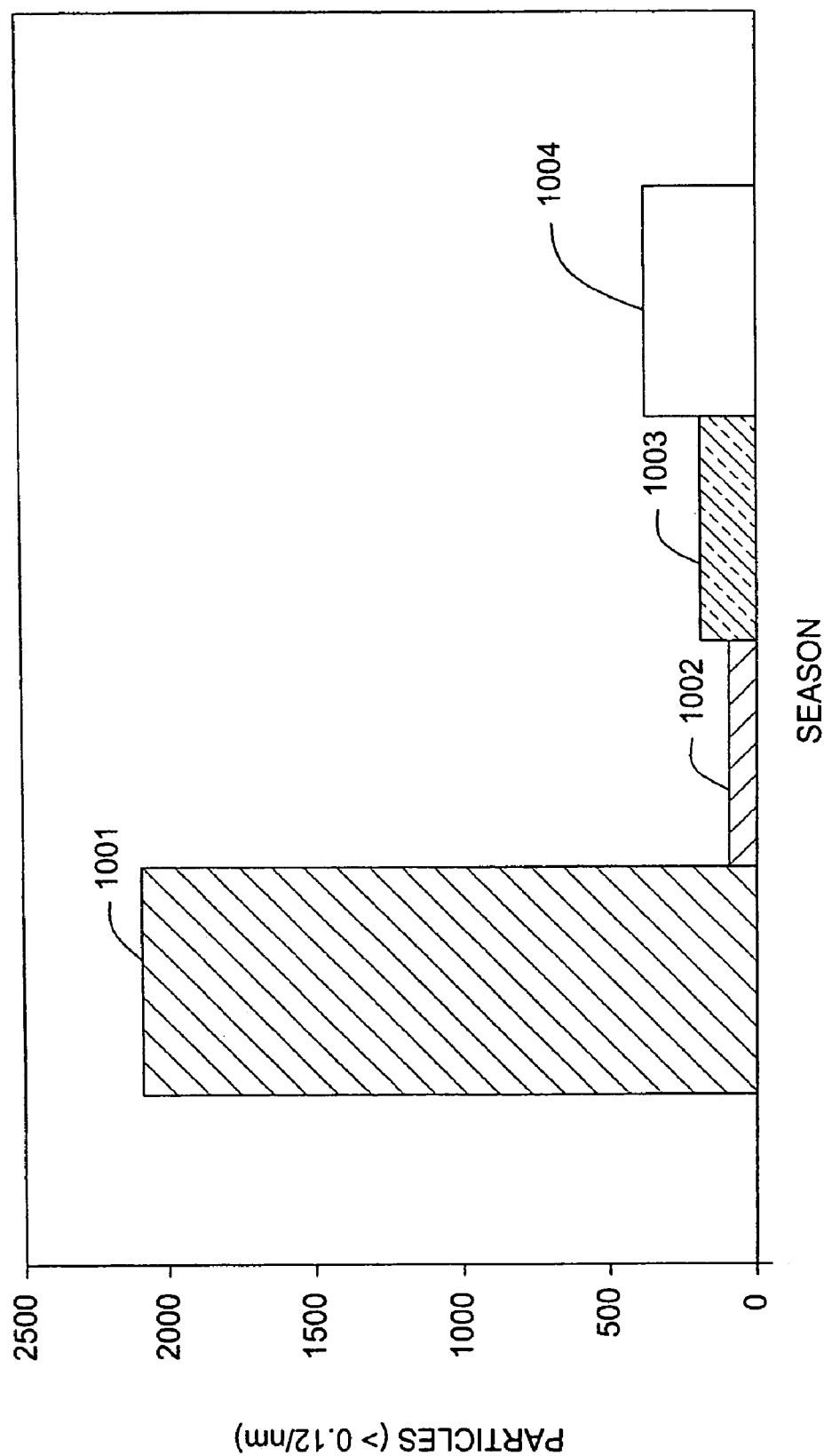
FIG. 10 illustrates the effect of seasoning on numbers of particles generated.
Figure 11:
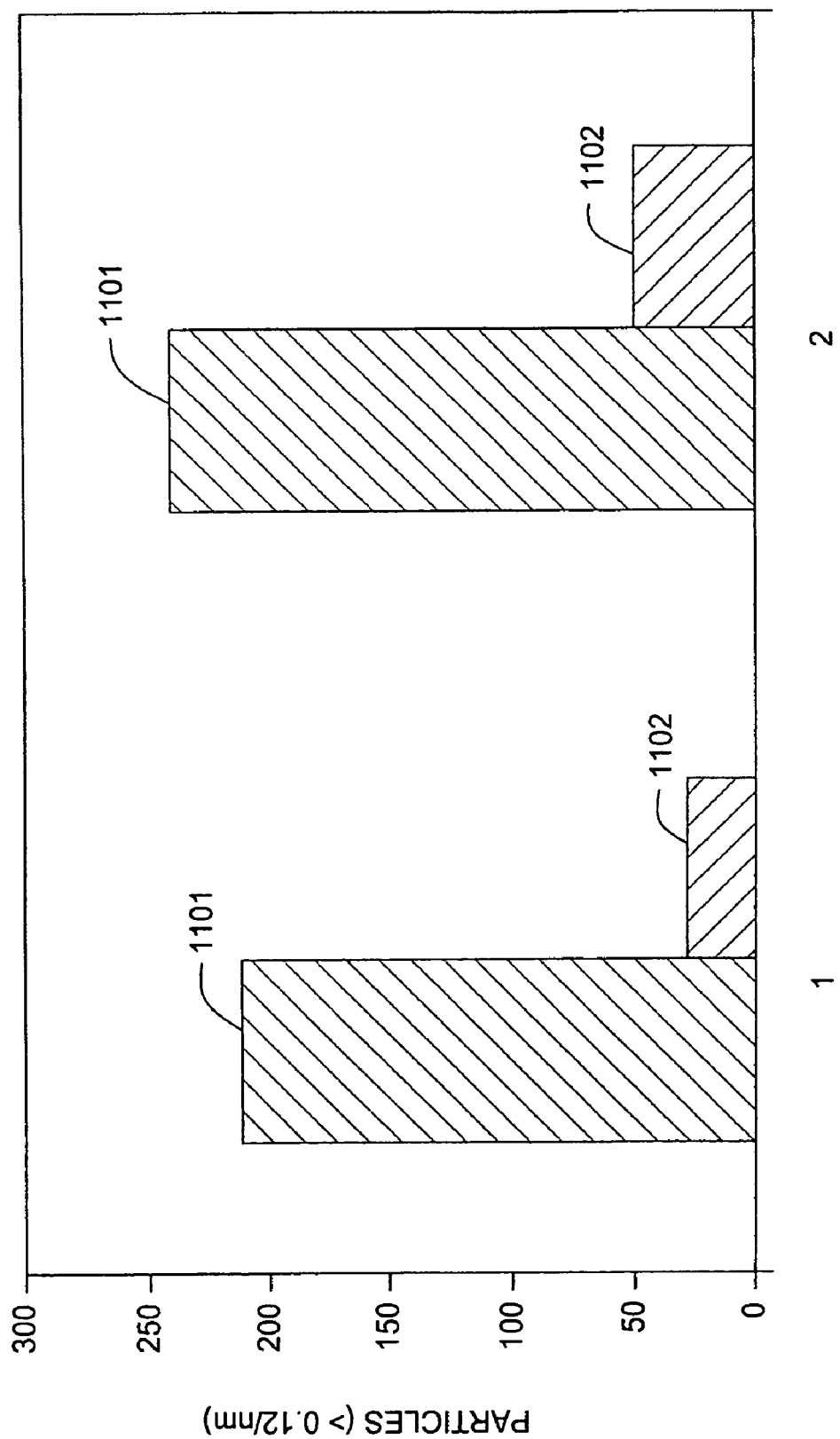
FIG. 11 illustrates the effect of wide spacing lift on numbers of particles generated.

The results are shown in FIG. 10, which demonstrate that without the seasoning film (deposition for a time period of 0 second), shown as 1001, particles more than about 0.12 μm were as many as about 2100 or more. The number of particles generated can be reduced to about 400, shown as 1004 in FIG. 10, in the case of seasoning for about 10 seconds, and surprisingly, can be further reduced by seasoning for a shorter period of time, such as for about 7 seconds (shown as 1003 in FIG. 10), and preferably for about 5 seconds (shown as 1002 in FIG. 10). It was concluded that, under the deposition condition as described herein, the presence of a seasoning carbon film before substrate deposition helped to reduce particle contamination when deposited at a lower temperature. Further, a certain thickness of the carbon film gave less particles than other thicknesses, in this case, 5 seconds seasoning was the optimum, which means basically quite a thin coating, and no seasoning at all was worse. In general, the thinner the seasoning film, the less particle contamination observed.

Example 2

Another example includes deposition of a carbon film at about 400° C. for a time period of about 10 seconds. The substrate was then introduced into the chamber and positioned 250 mils from the gas distribution system. A gas mixture of propylene and helium was introduced into the chamber before the initiation of RF power and an amorphous carbon layer was deposited on a substrate at a substrate temperature of about 400° C. After the amorphous carbon layer was deposited on the substrate, the RF power and flow of the gas mixture were terminated. The substrate was then positioned 1300 mils from the gas distribution system, while maintaining the chamber pressure. The chamber slit valve was opened to allow the gas mixture and/or plasma to be pumped out of the chamber. The numbers of the particles on the substrate were measured to see the effect of the position of the substrate from the gas distribution system on particle contamination.

The results are shown in FIG. 10, which demonstrate that even in the presence of a seasoning film, deposited for about 10 seconds, particles more than about 0.12 μm was further reduced when the substrate was moved to a different distance from the gas distribution system. For example, in FIG. 10, the numbers of particles were measured from between 200 to 250, shown as 1101 for substrate being about 250 mils away from the gas distribution system, and were reduced to between 0 to 50, shown as 1102 for substrate being about 1300 mils away from the gas distribution system.

Example 3

Still another example includes pre-cleaning the chamber with an in-situ oxygen plasma by supplying an oxygen gas and initiating a RF power. No carbon film was deposited before an amorphous carbon layer was deposited on a substrate from a gas mixture of propylene and helium at a substrate temperature of about 400° C. and RF power of 1600 W) at a frequency of 13.56 MHz applied to the gas distribution system. The flow of propylene was terminated while the flow of helium is still on for about 20 seconds. The substrate was positioned at about 250 mils from the gas distribution system. The chamber slit valve was opened to allow the gas mixture to be pumped out of the chamber. The numbers of the particles on the substrate were measured to see the effect of purging particles out of the chamber by the inert helium gas flow on particle contamination.

Figure 12:
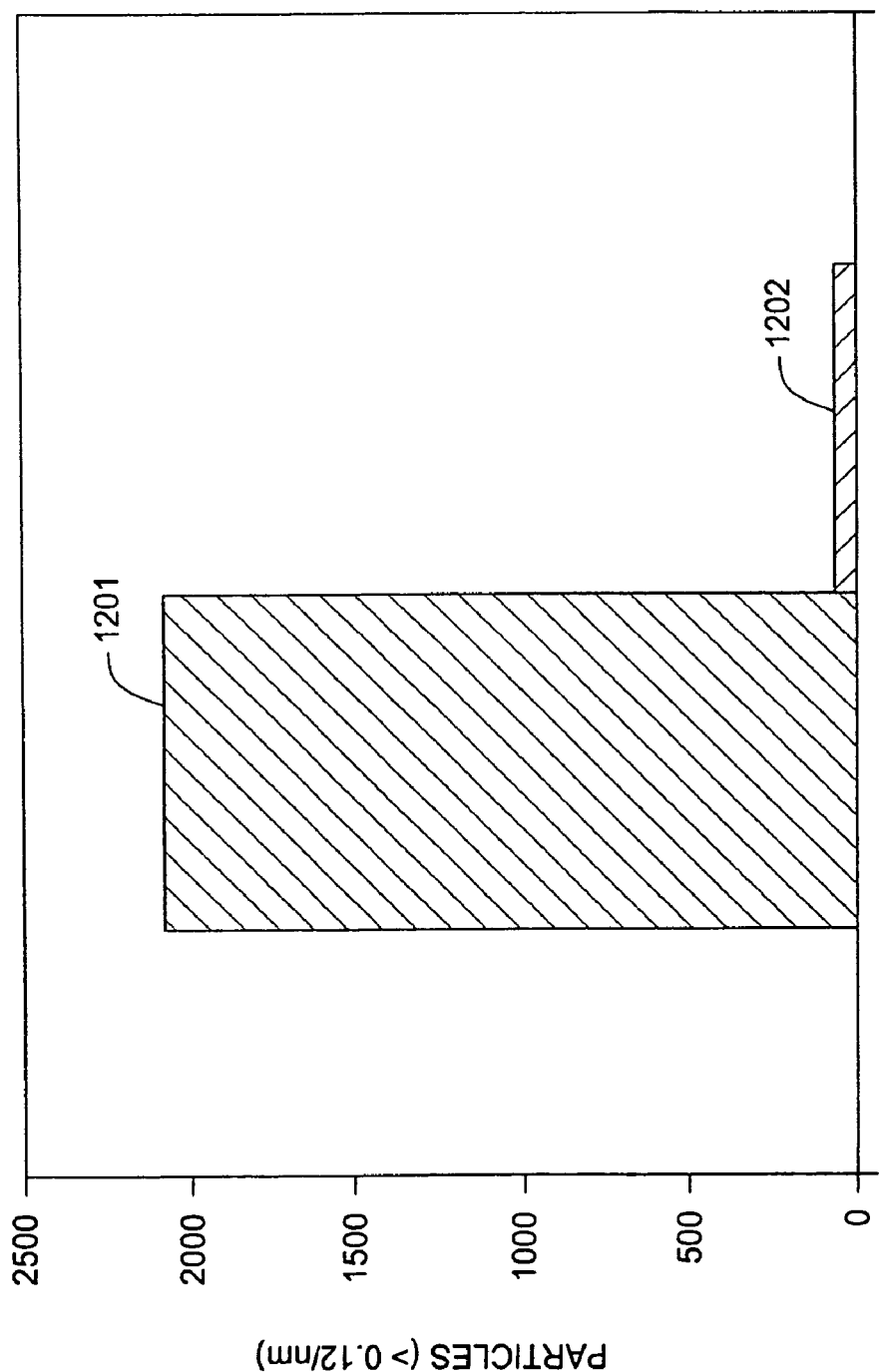
FIG. 12 illustrates the effect of purge conditions on numbers of particles generated.

The results are shown in FIG. 12, which demonstrate that without maintaining the inert helium gas, particles more than about 0.12 μm was as many as about 2088 or more, shown as 1201. The number of particles generated can be reduced to about 59, shown as 1202, by maintaining the flow of the helium gas after the flow of the propylene is terminated. The effect of this inert gas flow to reduce carbon particle numbers is very significant. FIG. 12 demonstrates a total reduction of particle contamination for about 35 fold, comparably.

Example 4

As another example, the chamber was pre-cleaned with an in-situ oxygen plasma by supplying an oxygen gas and initiating a RF power. A carbon film was deposited before an amorphous carbon layer was deposited on a substrate from a gas mixture of propylene and helium at a substrate temperature of about 400° C. and RF power of 1600 W at a frequency of 13.56 MHz applied to the gas distribution system. The flow of propylene was terminated while the flow of helium is still on for about 10 seconds at a flow rate of about 2500 sccm and a pressure of about 5 Torr. The substrate was moved to about 1000 mils from the gas distribution system. The chamber slit valve was then opened for about 5 seconds to allow the gas mixture to be pumped out of the chamber. The numbers of the particles on the substrate were measured to see the effect of purging particles out of the chamber by the inert helium gas flow on particle contamination.

Figure 13:
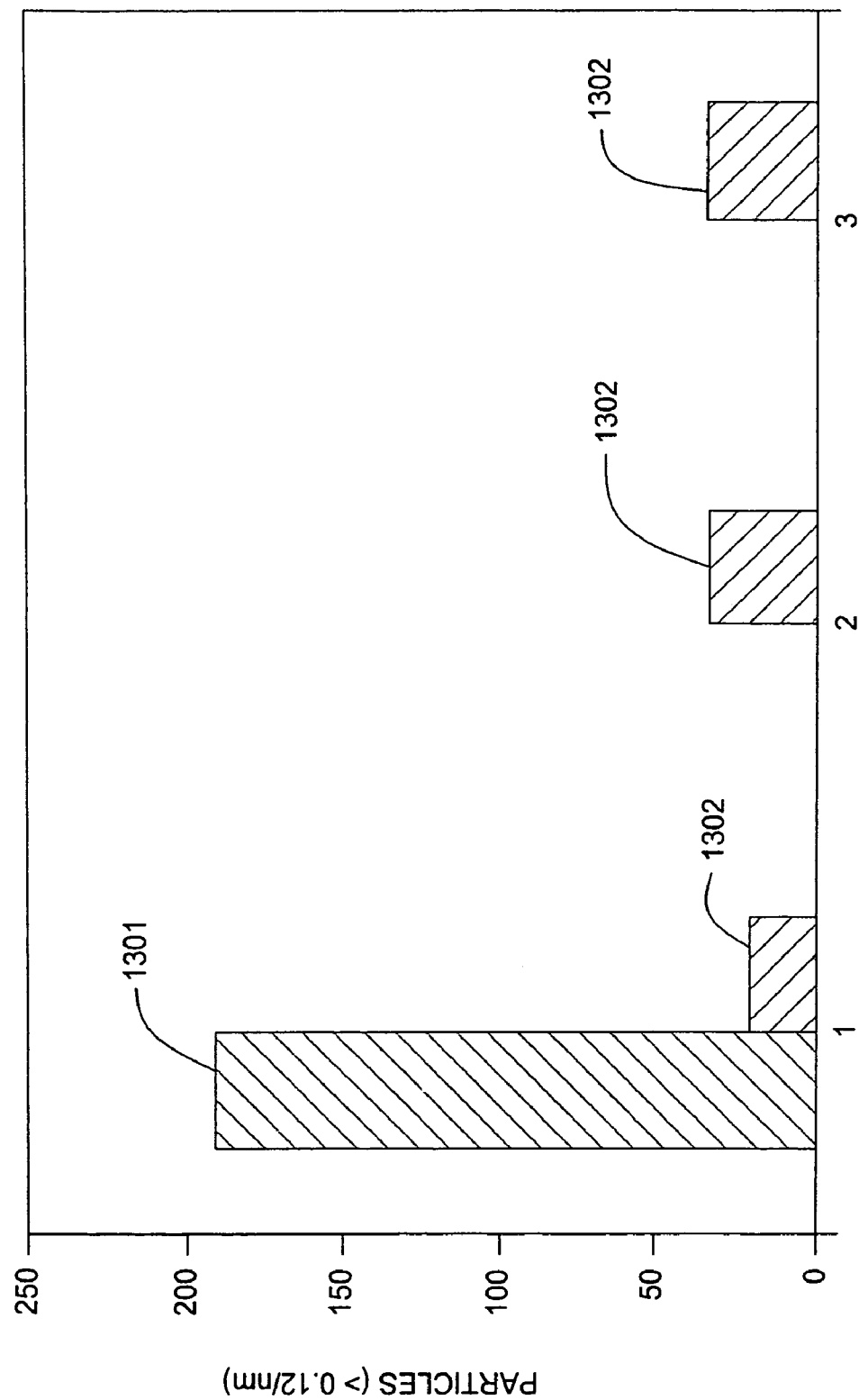
FIG. 13 illustrates purge conditions.

The results are shown in FIG. 13, which demonstrate that without maintaining the inert helium gas, particles more than about 0.12 μm was as many as about 190 or more, shown as 1301. The number of particles generated can be reduced to between about 21 and about 37, shown as 1302, by maintaining the flow of the helium gas after the flow of the propylene is terminated. In this example, the effect of this inert gas flow to reduce carbon particle numbers in the presence of wider spacing between the substrate support and the gas distribution system in FIG. 13 demonstrates a total reduction of particle contamination for about 9 fold to about 5 fold.

Example 5

In another example, the chamber was pre-cleaned with an in-situ oxygen plasma by supplying an oxygen gas and initiating a RF power. A carbon film was deposited before an amorphous carbon layer was deposited on a substrate from a gas mixture of propylene and helium at a substrate temperature of about 400° C. and RF power of 1600 W at a frequency of 13.56 MHz applied to the gas distribution system. The flow of propylene was terminated while the flow of helium at a flow rate of about 4500 sccm and RF power are maintained for about 10 seconds. The substrate was moved to about 1000 mils from the gas distribution system. The chamber slit valve was then opened for about 5 seconds to allow the gas mixture to be pumped out of the chamber. The numbers of the particles on the substrate were measured to see the effect of purging particles out of the chamber by the inert helium gas flow in the presence or absence of the RF power on particle contamination.

Figure 14:
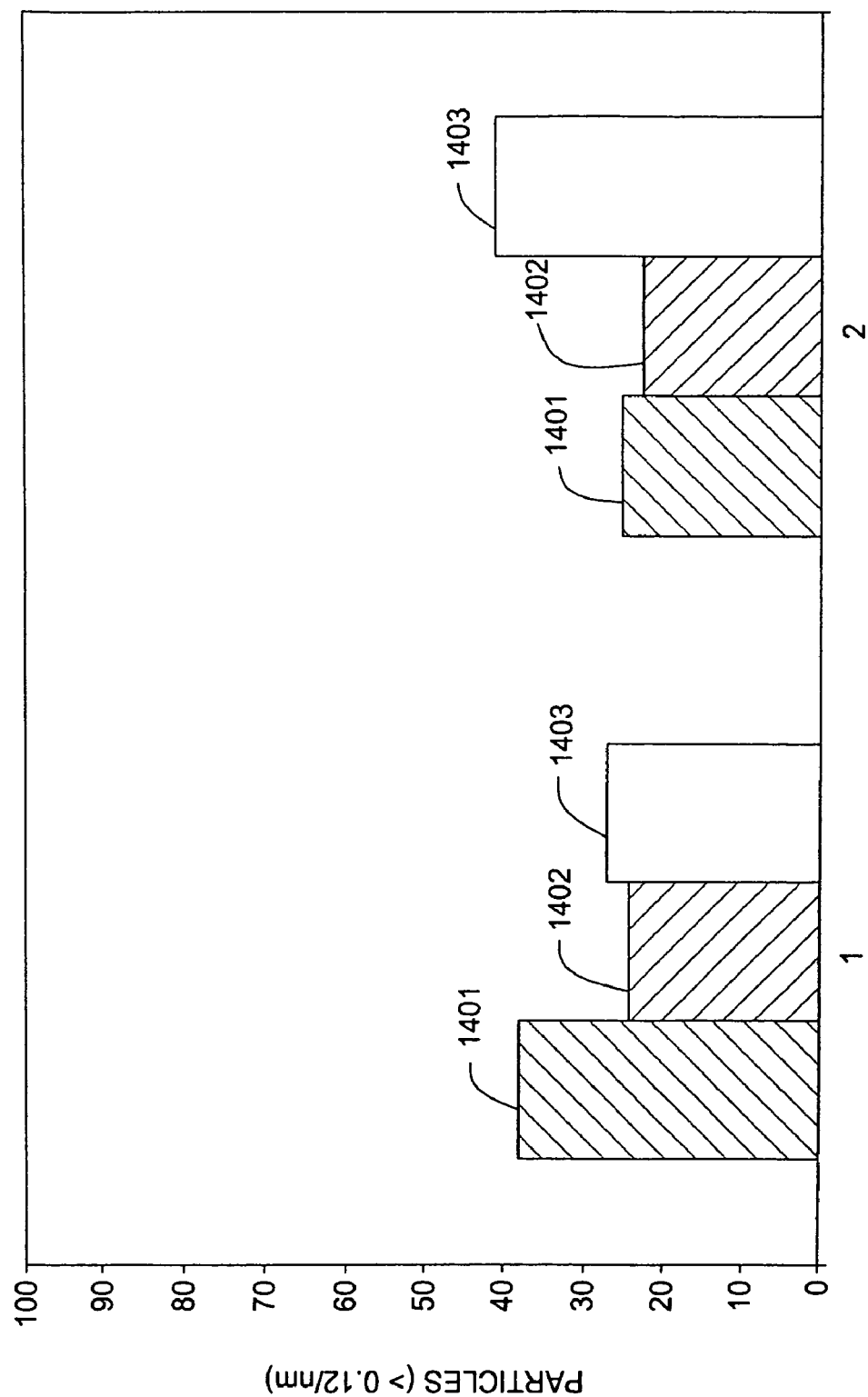
FIG. 14 illustrates the effect of purge conditions and RF power on numbers of particles generated.

The results are shown in FIG. 14, which demonstrate that maintaining the inert helium gas, particles more than about 0.12 μ were comparably the same. In FIG. 13, 1401 represents between about 20 and 40 particles measured under the conditions of helium purge for about 10 seconds without RF power and 1402 represents between about 20 and 30 particles measured under the conditions of helium purge for about 20 seconds in the absence of RF power. In the presence of RF power, 1403 represents between about 20 and 45 particles measured under the conditions of helium purge for about 10 seconds.

Example 6

In still another example, we tested the effect of flow rate of the inert gas, the pressure inside the chamber, and the distance between the substrate support and the gas distribution system on particle contamination. The chamber was pre-cleaned with an in-situ oxygen plasma by supplying an oxygen gas and initiating a RF power. A carbon film was deposited before an amorphous carbon layer was deposited on a substrate from a gas mixture of propylene and helium at a substrate temperature of about 400° C. and RF power of 1600 W at a frequency of 13.56 MHz applied to the gas distribution system. The flow of propylene was terminated while the flow of helium at a flow rate of about 2500 sccm or about 4500 sccm is maintained for about 10 seconds at a pressure of about 5.5 Torr or about 0.5–1.0 Torr (TFO). The substrate was moved to about 900 mills or about 2000 mils from. the gas distribution system. The chamber slit valve was then opened for about 5 seconds to allow the gas mixture to be pumped out of the chamber. The numbers of the particles on the substrate were measured.

Figure 15:
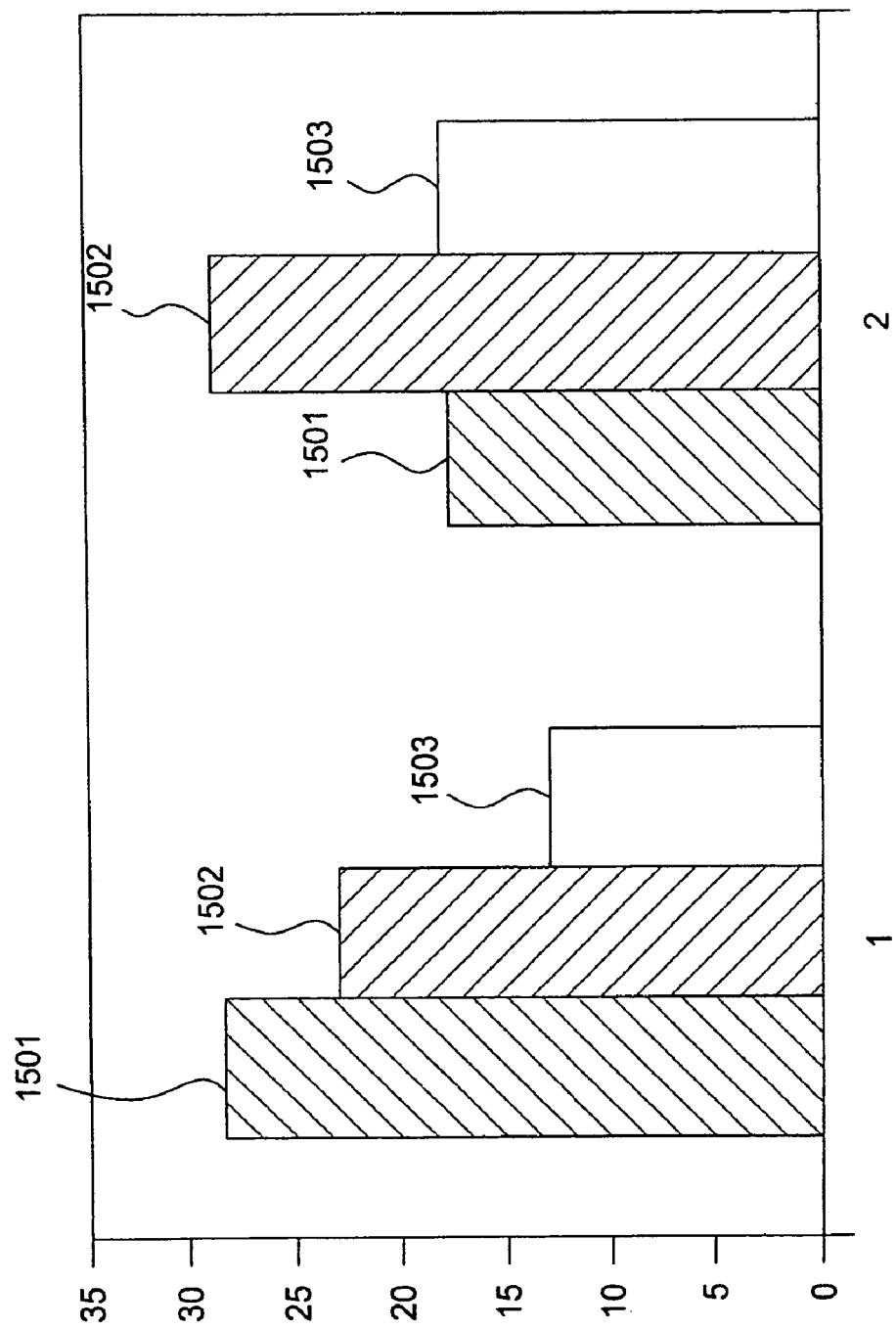
FIG. 15 compares the effect of purge conditions in the presence of RF power on numbers of particles generated.

The results are shown in FIG. 15, which demonstrate that higher flow rate of helium gas, minimal pressure, and maximum spacing between the substrate support and the gas distribution system provide the best particle control. In FIG. 14, 1501 represents between about 15 and 30 particles measured under the conditions of helium purge for about 10 seconds at a flow rate of about 2500 sccm, a pressure of about 5.5 Torr, and a spacing of about 900 mils from the gas distribution system, whereas, 1502 represents between about 20 and 30 particles measured under the conditions of helium purge for about 10 seconds at a flow rate of about 2500 sccm, a pressure of about 5.5 Torr, and a spacing of about 1200 mils from the gas distribution system. The best process conditions is shown as 1503, representing between about 10 and 20 particles measured under the conditions of helium purge for about 10 seconds at a flow rate of about 4500 sccm, a pressure of about 0.5–1.0 Torr (TFO), and a spacing of about 2000 mils from the gas distribution system.

Example 7

In order to see the repeatability of the data and demonstrate the robustness of the process conditions developed herein, about 1500 wafers were tested. For the first 1000 wafers, the helium gas flow was maintained at the end of the deposition of an amorphous carbon layer on the wafers. The last 500 wafers were prepared under the conditions that the helium gas flow was maintained in the presence of the RF power. The chamber was pre-cleaned with an in-situ oxygen plasma by supplying an oxygen gas and initiating a RF power. A carbon film was deposited for a deposition time of about 5 seconds before an amorphous carbon layer was deposited on a substrate from a gas mixture of propylene and helium at a substrate temperature of about 400° C. and RF power of 1600 W at a frequency of 13.56 MHz applied to the gas distribution system. The flow of propylene was terminated while the flow of helium is continued. The wafers were moved to a different distance from the gas distribution system. The chamber slit valve was then opened to allow the gas mixture to be pumped out of the chamber.

The numbers of the particles were measured after deposition of an amorphous carbon layer on 1000 wafers under the conditions described herein where the helium gas flow is continued and RF power was turned off, and additional 500 wafers under the conditions where both the helium gas flow and RF power are continued to be turned on. The results show that particles more then 0.12 µm (square dots) were measured to be average of about 17 and particles more then 0.16 µm (diamond dots) were measured to be average of about 7.

In addition, the thickness and uniformity of the amorphous carbon layer were measured after deposition under the conditions described herein. The thickness of the deposited amorphous carbon layer is about 2000 Å and wafer-to-wafer average is about 2.4%. Also, the refractive index of the amorphous carbon layer was measured after deposition under the conditions described herein. The results show that the refractive index at 248 nm of the deposited amorphous carbon layer is about 1.64±0.004 having a refractive index range average of about 0.004. Further, the extinction coefficient factor (k) of the amorphous carbon layer was measured after deposition of an amorphous carbon material on 1000 wafers under the conditions described herein where the helium gas flow is continued and RF power was turned off, and additional 500 wafers under the conditions where both the helium gas flow and RF power are continued to be turned on. The results show that k at 248 nm value of the amorphous carbon layer on the average is about 0.28±0.01, having a difference range of the k value for 1500 wafers to be average at about 0.009.

While the foregoing is directed to preferred embodiments of the present invention, other and further embodiments of the invention may be devised without departing from the basic scope thereof, and the scope thereof is determined by the claims that follow.

What is claimed is:

1. A method for processing a substrate in a chamber, comprising:

positioning a substrate inside the chamber; providing a gas mixture by flowing one or more hydrocarbon compounds and an inert gas to the deposition chamber;

applying an electric field to the gas mixture and heating the gas mixture to decompose the one or more hydrocarbon compounds in the gas mixture and generate a plasma;

depositing a material on the substrate for a deposition time; moving the substrate to a different distance from a gas distribution system of the chamber; and then terminating at least one gas flow of the one or more hydrocarbon compounds while still flowing the inert gas to the deposition chamber for a first time period, wherein any gas or plasma generated is pumped out of the chamber for a second time period, thereby reducing particle contamination on the substrate.

2. The method of claim 1, further comprising cleaning the chamber with a cleaning plasma before positioning the substrate, wherein the cleaning plasma is generated by flowing a cleaning gas into the chamber and applying an electric field.

3. The method of claim 2, wherein the cleaning gas is selected from the group consisting of oxygen-containing gas, hydrogen-containing gas, nitrogen-containing gas, oxygen gas, hydrogen gas, carbon dioxide, nitrous oxide, ammonium, helium, argon, and combinations thereof.

4. The method of claim 1, further comprising depositing the same material inside the chamber before positioning the substrate inside the chamber and depositing the material on the substrate.

5. The method of claim 4, wherein the same material is deposited inside the chamber for a deposition time of between about 5 seconds to about 30 seconds.

6. The method of claim 1, wherein the material is an amorphous carbon.

7. The method of claim 1, wherein the substrate is heated to a temperature between about 1000 C and about 6000 C.

8. The method of claim 1, wherein the deposition time is between about 5 seconds or longer.

9. The method of claim 1, wherein the first time period is between about 5 seconds to about 1 minute.

10. The method of claim 1, wherein the second time period is between about 5 seconds to about 3 minutes.

11. The method of claim 1, wherein the one or more hydrocarbon compounds comprises the general formula $C_xH_y$, wherein x has a range of 1 to 8 and y has a range of 2 to 18.

12. The method of claim 1, wherein the one or more hydrocarbon compounds are selected from the group consisting of methane ($CH_4$), ethane ($C_2H_6$), ethene ($C_2H_4$), propylene ($C_3H_6$), propyne ($C_3H_4$), propane ($C_3H_8$), butane ($C_4H_{10}$), butylene ($C_4H_8$), butadiene ($C_4H_6$), acetelyne ($C_2H_2$), benzene ($C_6H_6$), methyl benzene ($C_7H_8$), and combinations thereof.

13. The method of claim 1, wherein the electric field is generated by applying a power source selected from the group consisting of radiofrequency power, microwave frequency, and combinations thereof, and coupling to the deposition chamber in a way selected from the group consisting of inductively coupling, and capacitively coupling.

14. The method of claim 13, wherein the power source is turned off while the at least one gas flow of the one or more hydrocarbon compounds is terminated.

15. The method of claim 13, wherein the power source is still turned on while the at least one gas flow of the one or more hydrocarbon compounds is terminated.

16. The method of claim 1, wherein the inert gas is selected from the group consisting of helium, argon and combinations thereof.

17. The method of claim 1, wherein the substrate is moved to a different distance from a gas distribution system to be close to an exhaust of the chamber.

18. The method of claim 1, wherein the substrate is moved to a loading/unloading position.

* * * * *

UNITED STATES PATENT AND TRADEMARK OFFICE
CERTIFICATE OF CORRECTION

PATENT NO. : 7,094,442 B2
APPLICATION NO. : 10/891355
DATED : August 22, 2006
INVENTOR(S) : Martin Jay Seamons et al.

It is certified that error appears in the above-identified patent and that said Letters Patent is hereby corrected as shown below:

Column 7, Line 35: Change "second" to --seconds--

Column 9, Line 23: After "second", change "embodiment" to --time period--

Column 9, Line 24: Change "second embodiment" to --first time period--

Column 10, Line 50: Change "n" to --on--

Column 10, Line 61: Delete "($NH_3$)"

Column 13, line 3: Change "sup plied" to --supplied--

Column 15, Line 13: Change "10" to --11--

Column 15, Line 32: Delete the ")"after "W"

Column 15, Line 43: Change "was" to --were--

Column 16, Line 6: Change "was" to --were--

Column 16, Line 39: Change "µ" to -- µm--

Column 16, Line 39: Change "13" to --14--.

Column 16, Line 66: Delete the period after "from"

Column 17, Line 7: Change "14" to --15--

Column 18, Claim 1, Line 12: Insert an indentation after "chamber;"

Column 18, Claim 1, Line 20: Insert an indentation after "time;"

Column 18, Claim 7, Line 48: Change "1000" to --100°--

UNITED STATES PATENT AND TRADEMARK OFFICE
CERTIFICATE OF CORRECTION

PATENT NO. : 7,094,442 B2
APPLICATION NO. : 10/891355
DATED : August 22, 2006
INVENTOR(S) : Martin Jay Seamons et al.

It is certified that error appears in the above-identified patent and that said Letters Patent is hereby corrected as shown below:

Column 18, Claim 7, Line 48: Change "6000" to --600°--

Signed and Sealed this

Twenty-eighth Day of November, 2006

JON W. DUDAS
*Director of the United States Patent and Trademark Office*